(12) United States Patent
Ogihara et al.

(10) Patent No.: US 9,315,670 B2
(45) Date of Patent: Apr. 19, 2016

(54) COMPOSITION FOR FORMING RESIST UNDERLAYER FILM AND PATTERNING PROCESS

(71) Applicant: SHIN-ETSU CHEMICAL CO., LTD., Tokyo (JP)

(72) Inventors: Tsutomu Ogihara, Jyoetsu (JP); Jun Hatakeyama, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 45 days.

(21) Appl. No.: 14/165,921

(22) Filed: Jan. 28, 2014

(65) Prior Publication Data

US 2014/0235796 A1 Aug. 21, 2014

(30) Foreign Application Priority Data

Feb. 15, 2013 (JP) ................. 2013-027781

(51) Int. Cl.
| | | |
|---|---|---|
| G03F 7/075 | (2006.01) | |
| G03F 7/09 | (2006.01) | |
| G03F 7/20 | (2006.01) | |
| C08L 83/08 | (2006.01) | |
| G03F 7/00 | (2006.01) | |
| B82Y 10/00 | (2011.01) | |
| B82Y 40/00 | (2011.01) | |

(52) U.S. Cl.
CPC .............. *C08L 83/08* (2013.01); *B82Y 10/00* (2013.01); *B82Y 40/00* (2013.01); *G03F 7/0002* (2013.01); *G03F 7/0752* (2013.01); *G03F 7/0755* (2013.01); *G03F 7/094* (2013.01)

(58) Field of Classification Search
CPC ....... G03F 7/075; G03F 7/0755; G03F 7/095; G03F 7/11; G03F 7/20; G03F 7/26; G03F 7/40
See application file for complete search history.

(56) References Cited

U.S. PATENT DOCUMENTS

| | | | | |
|---|---|---|---|---|
| 4,898,786 | A * | 2/1990 | Swofford ................ | 428/480 |
| 5,632,910 | A | 5/1997 | Nagayama et al. | |
| 2003/0235786 | A1 | 12/2003 | Krishnamurthy et al. | |
| 2004/0191479 | A1 | 9/2004 | Hatakeyama et al. | |
| 2007/0231738 | A1 | 10/2007 | Kaneko et al. | |
| 2007/0238300 | A1 | 10/2007 | Ogihara et al. | |
| 2008/0312400 | A1 | 12/2008 | Yamashita et al. | |
| 2009/0050020 | A1 * | 2/2009 | Konno et al. ............ | 106/287.12 |
| 2009/0136869 | A1 | 5/2009 | Ogihara et al. | |
| 2010/0285407 | A1 | 11/2010 | Ogihara et al. | |
| 2011/0143149 | A1 * | 6/2011 | Shibayama et al. ......... | 428/447 |
| 2011/0287369 | A1 | 11/2011 | Shibayama et al. | |
| 2012/0052685 | A1 * | 3/2012 | Ogihara et al. ............... | 438/702 |
| 2012/0070994 | A1 | 3/2012 | Kanno et al. | |
| 2012/0315765 | A1 | 12/2012 | Nakajima et al. | |
| 2013/0005150 | A1 * | 1/2013 | Ogihara et al. ............... | 438/694 |
| 2014/0170855 | A1 | 6/2014 | Nakajima et al. | |

FOREIGN PATENT DOCUMENTS

| | | | |
|---|---|---|---|
| JP | 07-118392 | * | 5/1995 |
| JP | A-7-181688 | | 7/1995 |
| JP | A-7-183194 | | 7/1995 |
| JP | A-11-258813 | | 9/1999 |
| JP | A-2000-53921 | | 2/2000 |
| JP | 2004-310019 A | | 11/2004 |
| JP | A-2005-520354 | | 7/2005 |
| JP | A-2005-537502 | | 12/2005 |
| JP | A-2006-251369 | | 9/2006 |
| JP | A-2007-297590 | | 11/2007 |
| JP | A-2007-302873 | | 11/2007 |
| JP | 2008-309929 A | | 12/2008 |
| JP | A-2009-126940 | | 6/2009 |
| JP | 2009-244722 A | | 10/2009 |
| JP | B2-4716037 | | 7/2011 |
| JP | B2-5038354 | | 10/2012 |
| JP | 2013-033187 A | | 2/2013 |
| WO | WO 2004/007192 A1 | | 1/2004 |
| WO | 2010/021290 A1 | | 2/2010 |
| WO | 2010/071155 A1 | | 6/2010 |
| WO | 2010/140551 A1 | | 12/2010 |
| WO | 2011/102470 A1 | | 8/2011 |
| WO | 2013/022099 A1 | | 2/2013 |

OTHER PUBLICATIONS

Machine translation of JP 07-118392, published on May 9, 1995.*
Nakamukra et al., "Contact Hole Formation by Multiple Exposure Technique in Ultra-Low $k_1$ Lithography," *Proceedings of SPIE*, 2004, vol. 5377, pp. 255-263.
May 26, 2015 Office Action issued in Japanese Application No. 2013-027781.

\* cited by examiner

*Primary Examiner* — Anca Eoff
(74) *Attorney, Agent, or Firm* — Oliff PLC

(57) ABSTRACT

The invention provides a composition for forming a resist underlayer film including: as a component (A), a silicon-containing compound obtained by hydrolysis and/or condensation of one or more kinds of silicon compounds represented by the following general formula (A-1). There can be provided a composition for forming a resist underlayer film having etching selectivity relative to a conventional organic film and a silicon-containing film and favorable pattern adhesiveness relative to fine pattern even in a complicated patterning process.

$$R^{1A}_{a1}R^{2A}_{a2}R^{3A}_{a3}Si(OR^{0A})_{(4-a1-a2-a3)} \quad (A\text{-}1)$$

14 Claims, No Drawings

US 9,315,670 B2

COMPOSITION FOR FORMING RESIST UNDERLAYER FILM AND PATTERNING PROCESS

FIELD OF THE INVENTION

The present invention relates to a composition for forming a resist underlayer film used in a multilayer resist method used for fine processing in a step for producing a semiconductor device, and a patterning process using the same.

DESCRIPTION OF THE RELATED ART

In the 1980s, exposure light whose source is g-beam (436 nm) or i-beam (365 nm) of a mercury lamp was commonly used for resist patterning. To achieve a further micro resist pattern, a method for making an exposure wavelength shorter has been regarded as more effective means. In the 1990s, 64 MB (work size: 0.25 µM or less) dynamic random access memory (DRAM) and subsequent electronic devices were mass produced, in which short-wavelength KrF excimer laser (248 nm) were employed as an exposure source instead of the i-beam (365 nm). In reality, however, the production of DRAMs with an integration degree of 256 MB and 1 GB or more requires finer processing technology (work size: 0.2 µM or less), and needs a light source of a shorter wavelength. Amid this technological need, the introduction of photolithography using ArF excimer laser (193 nm) has been seriously studied since about a decade ago. According to initial strategy, ARF lithography was going to be introduced in conjunction with the production of 180 nm-node devices, but a conventional KrF excimer lithography was continuously used until 130 nm-node device mass production. Therefore, official introduction of ARF lithography started with 90 nm-node device production. Meanwhile, mass production of 65 nm-node devices, having lenses whose numerical aperture (NA) was raised to 0.9, are being promoted. Because of advantageous shorter exposure wavelength, $F_2$ lithography with a wavelength of 157 nm was regarded as a next promising production technology for subsequent 45 nm-node devices. However, development of $F_2$ lithography was canceled due to several problems such as higher scanner costs from expensive $CaF_2$ single crystals into projection lenses in large volumes, change in the optical system in accordance with introduction of hard pellicles instead of conventional extremely low durable soft pellicles, and reduced etch resistance of a resist film, thereby introducing ArF-immersion lithography. In the ArF-immersion lithography, water with a refractive index of 1.44 is inserted between a projection lens and a wafer by partial fill method, enabling high-speed scanning. Accordingly, 45 nm-node devices are mass produced by using lenses with an NA of 1.3.

Extreme-ultraviolet (EUV) lithography with a wavelength of 13.5 nm is regarded as a next promising fine processing technology by using 32 nm-node lithography. Unfortunately, the EUV lithography is prone to numerous technical problems such as needs for higher laser output, higher sensitivity of a resist film, higher resolution, lower line edge roughness (LER), use of defect-free MoSi laminated mask, and lower aberration of a reflective mirror. Development of another promising 32 nm-node device production technology, or high-refractive index immersion lithography, was canceled due to low transmission factor of another promising high-refractive index lens (LUAG) and an inability to obtain a target value of a liquid's refractive index at 1.8. Under the circumstances, general-purpose light exposure technology seems to fail to significantly improve the resolution unless a light source wavelength is changed.

Accordingly, development of a fine processing technology for obtaining a work size exceeding a limiting resolution of an existing ArF-immersion exposure technology has been promoted. As a technology thereof, double patterning technology is being proposed. Specifically, the double patterning technology is a method for forming a first photoresist pattern with an interval rate of a line to a space of 1:3 by using first exposure and development, processing an underlayer hard mask by dry etching, laying another hard mask thereon, forming a second line pattern at a space portion obtained by the first exposure by using second exposure and development of a photoresist film, processing the hard mask by dry etching, and alternately forming the first pattern and the second pattern. Also, there is another method for forming a first photoresist pattern with an interval rate of a line to a space of 1:3 by using first exposure and development, processing an underlayer hard mask by dry etching, forming a pattern on a remaining portion of the hard mask by using second exposure by applying a photoresist film on the underlayer hard mask, and processing the hard mask by dry etching with the pattern as a mask. In both methods, by processing a hard mask by two dry etching, a pattern whose pitch is half that of an exposure pattern can be formed. Nevertheless, while the former method requires formation of a hard mask twice, the latter method needs one-time hard mask formation, but additional formation of a trench pattern which is more difficult to resolve than a line pattern.

Another method proposed is to form a line pattern on a positive resist film in X direction by using a dipole light, cure a resist pattern, apply a resist composition thereon again, expose a line pattern in Y direction by using a dipole light, and form a hole pattern from a gap of a grid-like line pattern (Non-Patent Document 1). Moreover, with a resist pattern, an organic hard mask whose pattern is transferred and a polysilicon film as a core pattern, a method for halving a pitch by one-time pattern exposure by spacer technology of removing a core pattern by using dry etching, after forming a silicon oxide film therearound at a low temperature, is being proposed.

Accordingly, since finer processing is difficult to achieve only by using a resist film present in an upper layer, a micropatterning process cannot readily be introduced without using a hard mask formed in an underlayer of a resist film. Under the circumstances, multilayer resist method is known as a method for using a hard mask as a resist underlayer film. The method is to transfer a pattern in a resist underlayer film by dry etching, with an upper layer resist pattern as an etching mask, after interposing a photoresist film, or an underlayer film whose etching selectivity is different from a resist upper layer film (e.g. a silicon-containing resist underlayer film) between a resist upper layer film and a substrate to be processed to obtain a pattern in the resist upper layer film, and further transfer a pattern on the substrate to be processed or a core film for processing a spacer by dry etching, with a resist underlayer film as an etching mask.

Illustrative example of the composition for forming a resist underlayer film used in this multilayer resist method includes a silicon-containing inorganic film obtained by CVD method such as an $SiO_2$ film (e.g., Patent Document 1) and an SiON film (e.g., Patent Document 2), and illustrative example of a spin-coating film includes a spin-on glass (SOG) film (e.g., Patent Document 3) and a crosslinking silsesquioxane film (e.g., Patent Document 4).

Academic attention has been focused on a resist underlayer film that can be used as a multilayer film resist method, such as a composition for forming a silicon-containing resist underlayer film described in Patent Documents 5 and 6. However, a process for producing a semiconductor device whose resolution exceeds a limiting resolution of a recent ArF-immersion lithography is currently considered to employ a complicated process such as the above-described double patterning. In fact, it is hard to construct a reasonable process in a conventional resist underlayer film. In particular, adhesiveness with regard to the above-described micropatterning process has become problematic.

Currently, in order to construct a reasonable process for producing a semiconductor device, etching selectivity relative to an organic film or a silicon-containing film introduced as a conventional resist film is regarded essential. In association therewith, resist underlayer films containing a variety of metal species are proposed (Patent Documents 7 to 9). For example, Patent Document 7 discloses KrF patterning evaluation using polytitanoxane, but no patterning evaluation by ArF-immersion exposure. Patent Document 8 discloses patterning evaluation by i-beam exposure using a hydrolysate of each type of metal alkoxide, but no patterning evaluation by ArF-immersion exposure, leading to no actual data of patterning performance. Patent Document 9 proposes not only titanium- but also zirconium-containing resist underlayer film, but no patterning evaluation results leading to unknown actual patterning performance.

In this manner, in order to construct a reasonable process for producing a semiconductor device, a resist underlayer film is required unlike a conventional one, so as to have favorable pattern adhesiveness relative to fine pattern and etching selectivity relative to an organic film or a silicon-containing film.

Patent Document 1: Japanese Patent Laid-Open Publication No. 7-183194
Patent Document 2: Japanese Patent Laid-Open Publication No. 7-181688
Patent Document 3: Japanese Patent Laid-Open Publication No. 2007-302873
Patent Document 4: Japanese Patent Laid-Open Publication No. 2005-520354
Patent Document 5: Japanese Patent No. 4716037
Patent Document 6: Japanese Patent No. 5038354
Patent Document 7: Japanese Patent Laid-Open Publication No. 11-258813
Patent Document 8: Japanese Patent Laid-Open Publication No. 2006-251369
Patent Document 9: Japanese Patent Laid-Open Publication No. 2005-537502
Non-Patent Document 1: Proc. SPIE Vol. 5377 p 255 (2004)

SUMMARY OF THE INVENTION

The present invention was made in view of the above situation, and has an object to provide a product for forming a resist underlayer film for forming a resist underlayer film having etching selectivity relative to a conventional organic film and a silicon-containing film and favorable pattern adhesiveness relative to fine pattern in a complicated patterning process.

The present invention provides a composition for forming a resist underlayer film, comprising:

as a component (A), a silicon-containing compound obtained by hydrolysis and/or condensation of one or more kinds of silicon compounds represented by the following general formula (A-1), $$R^{1A}_{a1}R^{2A}_{a2}R^{3A}_{a3}Si(OR^{0A})_{(4-a1-a2-a3)} \quad (A\text{-}1)$$

wherein, $R^{0A}$ represents a hydrocarbon group having 1 to 6 carbon atoms; any one or more of $R^{1A}$, $R^{2A}$ and $R^{3A}$ is an organic group having nitrogen atom, sulfur atom, phosphorus atom, or iodine atom, and the other(s) are a hydrogen atom or a monovalent organic group having 1 to 30 carbon atoms; and a1, a2 and a3 represent 0 or 1 and satisfy $1 \le a1+a2+a3 \le 3$.

The composition for forming a resist underlayer film can form a resist underlayer film having etching selectivity relative to a conventional organic film and a silicon-containing film, and in particular, favorable pattern adhesiveness relative to fine pattern in a complicated patterning process.

The component (A) preferably contains a silicon-containing compound obtained by hydrolysis and/or condensation of one or more kinds of silicon compounds represented by the general formula (A-1) and one or more kinds of silicon compounds represented by the following general formula (A-2), $$R^{5A}_{a5}R^{6A}_{a6}R^{7A}_{a7}Si(OR^{4A})_{(4-a5-a6-a7)} \quad (A\text{-}2)$$

wherein, $R^{4A}$ represents a hydrocarbon group having 1 to 6 carbon atoms; each of $R^{5A}$, $R^{6A}$ and $R^{7A}$ represents a hydrogen atom or a monovalent organic group having 1 to 30 carbon atoms; and a5, a6 and a7 represent 0 or 1 and satisfy $0 \le a5+a6+a7 \le 3$.

The component (A) can provide a resist underlayer film having more favorable pattern adhesiveness relative to fine pattern.

Moreover, the composition for forming a resist underlayer film preferably comprises:

as a component (B), a metal-containing compound obtained by hydrolysis and/or condensation of one or more kinds of metallic compounds represented by the following general formula (B-1), $$M(OR^{0B})_{b0}(OR^{1B})_{b1}(O)_{b2} \quad (B\text{-}1)$$

wherein, $R^{0B}$ and $R^{1B}$ represent an organic group having 1 to 10 carbon atoms; b0, b1 and b2 represent an integer of 0 or more and $b0+b1+2 \times b2$ is the same number as the number determined by valency of M; and M is an element belonging to groups of III, IV, or V in a periodic table except for carbon.

Accordingly, by adding the component (B) to the composition for forming a resist underlayer film, the present invention can provide a resist underlayer film having a sufficient etching selectivity relative to an organic film and a silicon-containing film, in addition to favorable pattern adhesiveness relative to fine pattern.

In this case, any one or more of $R^{1A}$, $R^{2A}$ and $R^{3A}$ in the general formula (A-1) is preferably an organic group containing tertiary sulfonium, secondary iodonium, or quaternary phosphonium, or quaternary ammonium having non-nucleophilic counter anion.

In this case, any one or more of $R^{1A}$, $R^{2A}$ and $R^{3A}$ in the general formula (A-1) is preferably an organic group containing primary amine, secondary amine, tertiary amine, or heterocycle.

Adhesiveness relative to fine pattern can be improved by using the silicon compound as a raw material of the component (A).

The component (A) preferably contains a silicon-containing compound obtained by hydrolysis and/or condensation of one or more kinds of silicon compounds represented by the general formula (A-1), one or more kinds of silicon compounds represented by the general formula (A-2) and one or more kinds of metallic compounds represented by the following general formula (A-3), $$L(OR^{8A})_{a8}(OR^{9A})_{a9}(O)_{a10} \quad (A\text{-}3)$$

wherein, $R^{8A}$ and $R^{9A}$ represent an organic group having 1 to 30 carbon atoms; a8, a9 and a10 represent an integer of 0 or more and a8+a9+2×a10 is the same number as the number determined by valency of L; and L is an element belonging to groups of III, IV, or V in a periodic table except for carbon and silicon.

By further adding the metallic compound as a raw material of the component (A), etching selectivity relative to an organic film and a silicon-containing film can be improved, in addition to the pattern adhesiveness.

The component (B) preferably contains a metal-containing compound obtained by hydrolysis and/or condensation of one or more kinds of metallic compounds represented by the general formula (B-1) and one or more kinds of silicon compounds represented by the following general formula (B-2),

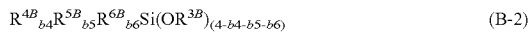
(B-2)

wherein, $R^{3B}$ represents a hydrocarbon group having 1 to 6 carbon atoms; each of $R^{4B}$, $R^{5B}$ and $R^{6B}$ represents a hydrogen atom or a monovalent organic group having 1 to 30 carbon atoms; and b4, b5 and b6 represent 0 or 1 and satisfy $1 \leq B4+b5+b6 \leq 3$.

Adhesiveness relative to fine pattern can be further improved, in addition to etching selectivity, by using the silicon compound as a raw material of the component (B).

The mass ratio of the component (A) and the component (B) preferably satisfies component (B) component (A).

With the mass ratio, etching selectivity relative to an organic film and a silicon-containing film can be sufficiently obtained.

Preferably, M in the general formula (B-1) is any element of silicon, aluminum, germanium, titanium, zirconium, or hafnium.

By using the metallic compound as a raw material of the component (B), etching selectivity relative to an organic film and a silicon-containing film can be further improved.

L in the general formula (A-3) is preferably any element of boron, aluminum, gallium, yttrium, germanium, titanium, zirconium, hafnium, bismuth, tin, phosphorus, vanadium, arsenic, antimony, niobium, or tantalum.

By using the metallic compound as a raw material of the component (A), etching selectivity relative to an organic film and a silicon-containing film can be further improved.

In addition, the present invention provides a patterning process on a body to be processed comprising: forming an organic underlayer film on a body to be processed by using an application-type organic underlayer film composition; forming a resist underlayer film on the organic underlayer film by using the composition for forming a resist underlayer film; forming a resist upper layer film on the resist underlayer film by using a composition for forming a resist upper layer film; forming a pattern on the resist upper layer film; transferring the pattern on the resist underlayer film by using the resist upper layer film having the formed pattern as a mask; transferring a pattern on the organic underlayer film by using the resist underlayer film having the transferred pattern as a mask; and transferring a pattern on the body to be processed by using the organic underlayer film having the transferred pattern as a mask.

In addition, the present invention provides a patterning process on a body to be processed comprising: forming an organic hard mask with carbon as a main component on a body to be processed by a CVD method; forming a resist underlayer film on the organic hard mask by using the composition for forming a resist underlayer film; forming a resist upper layer film on the resist underlayer film by using a composition for forming a resist upper layer film; forming a pattern on the resist upper layer film; transferring a pattern on the resist underlayer film by using the resist upper layer film having the formed pattern as a mask; transferring a pattern on the organic hard mask by using the resist underlayer film having the transferred pattern as a mask; and transferring a pattern on the body to be processed by using the organic hard mask having the transferred pattern as a mask.

By patterning by using a composition for forming a resist underlayer film of the present invention, optimization of a combination of an organic underlayer film and an organic hard mask as described above can form a pattern that is formed on a resist upper layer on a body to be processed by transferring the pattern without a size conversion difference.

The body to be processed is preferably a semiconductor device substrate coated, as a layer to be processed, with any of metal film, metal carbide film, metal oxide film, metal nitride film, metal oxycarbide film, and metal oxynitride film.

Moreover, a metal that constitutes the body to be processed is preferably silicon, titanium, tungsten, hafnium, zirconium, chromium, germanium, copper, aluminum, indium, gallium, arsenic, palladium, iron, tantalum, iridium, molybdenum, or an alloy of these metals.

In this manner, the patterning process of the present invention can form a pattern by processing the body to be processed as described above.

In the patterning process, a method for forming pattern on the resist upper layer film is preferably any of the method of photolithography with a wavelength of 300 nm or less or EUV beam, the method of a direct drawing with electron beam, the directed self assembly method and the nano-imprinting lithography method.

By using one of these methods, fine pattern can be formed on a resist upper layer film.

The composition for forming a resist underlayer film of the present invention can form a resist underlayer film having favorable pattern adhesiveness relative to fine pattern of a resist upper layer film formed in an upper portion and a high etching selectivity relative to both a resist pattern formed in an upper portion and an organic film or an organic hard mask formed in a lower portion. The patterning process of the present invention by using the composition for forming a resist underlayer film can fetch fine pattern of a resist upper layer film from a resist underlayer film, an organic underlayer film to an organic hard mask to transfer the pattern without size conversion difference, and can ultimately process a body to be processed with a high precision by using the organic underlayer film or the organic hard mask as an etching mask.

DETAILED DESCRIPTION OF THE PREFERRED EMBODIMENTS

Inventors of the present invention carried out an extensive investigation with a purpose to obtain a resist underlayer film having adhesiveness relative to fine pattern, by using a silicon compound having an organic group having nitrogen atom, sulfur atom, phosphorus atom, or iodine atom such as sulfonium, iodonium, phosphonium, ammonium, and amine, which has been conventionally used as a crosslinking accelerator as a raw material of a component of a composition for forming a resist underlayer film. Based on that information, the present invention was accomplished.

The present invention provides a composition for forming a resist underlayer film, comprising:

as a component (A), a silicon-containing compound obtained by hydrolysis and/or condensation of one or more kinds of silicon compounds represented by the following general formula (A-1),

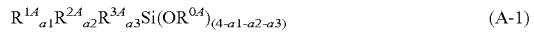
(A-1)

wherein, $R^{0A}$ represents a hydrocarbon group having 1 to 6 carbon atoms; any one or more of $R^{1A}$, $R^{2A}$ and $R^{3A}$ is an organic group having nitrogen atom, sulfur atom, phosphorus atom, or iodine atom, and the other(s) are a hydrogen atom or a monovalent organic group having 1 to 30 carbon atoms; and a1, a2 and a3 represent 0 or 1 and satisfy $1 \leq a1+a2+a3 \leq 3$.

Accordingly, a resist underlayer film having etching selectivity relative to a conventional organic film and a silicon-containing film and favorable pattern adhesiveness relative to fine pattern even in a complicated patterning process can be formed, by using at least one of the above silicon compounds with an organic group having nitrogen atom, sulfur atom, phosphorus atom, or iodine atom as a raw material of a component of a composition for forming a resist underlayer film.

Inventors of the present invention carried out another extensive investigation to obtain a resist underlayer film whose etching selectivity relative to an organic film and a silicon-containing film is improved in addition to pattern adhesiveness. They considered the possibility of obtaining a 2-layer coating film, in which a silicon-containing film whose adhesiveness is excellent is unevenly present in a surface layer portion thereof. A metal-containing compound is further added to the above composition for forming a resist underlayer film to prepare a metal-containing underlayer film whose etching selectivity is made more excellent as a lower layer portion of resist underlayer film.

Japanese Patent Laid-Open Publication No. 2000-53921 discloses a method for forming a 2-layer coating film. This is a method for forming a 2-layer antireflection film capable of reducing reflection of a visible light by using a composition for forming an antireflection film containing a compound that can provide a cured film having a low refractive index composed of a fluorine atom and a compound that can provide a cured film having a high refractive index whose surface free energy is higher than the above compound as a constituent. In fact, a 2-layer structure is formed by phase separation after molecule's alignment and aggregate in itself proceed, so that the free energy of a film surface becomes a minimum level in a film formed. The method forms a 2-layer structure by one-time coating to reduce the reflectance and maintain productivity at the same time. Nevertheless, if a difference in polymer free energy is not appropriate, resulting phase separation doesn't always form a 2-layer structure. A sea-island structure in which a matrix of one phase has a dotted domain of the other phase is often found, and it is necessary to find out a favorable combination of compositions in order to form a 2-layer antireflection film.

It is widely known that a surfactant having a perfluoroalkyl group or a siloxane comes up to a resist film surface after spin-coating to cover a surface. This phenomenon is attributable to energy stabilization after a perfluoroalkyl group and a siloxane having a low surface energy are oriented to the surface. Japanese Patent Laid-Open Publication No. 2007-297590 discloses that a polymer having —C(CF$_3$)$_2$OH structure is oriented to a photoresist film surface when it is added to a photoresist film.

It was found that the present invention can provide a 2-layer composition for forming a resist underlayer film composed of a surface layer having favorable pattern adhesiveness and an underlayer having etching selectivity without a sea-island structure. The 2-layer composition can be obtained by adding a metal-containing compound having a specific structure whose surface energy is higher than a silicon-containing compound to a crosslinking silicon-containing compound with a low surface energy as a raw material of the composition for forming a resist underlayer film.

The present invention provides a composition for forming a resist underlayer film, further comprising:

as component (B), a metal-containing compound obtained by hydrolysis and/or condensation of one or more kinds of metallic compounds represented by the following general formula (B-1) in the composition for forming resist underlayer film,

$$M(OR^{OB})_{b0}(OR^{1B})_{b1}(O)_{b2} \qquad (B-1)$$

wherein, $R^{OB}$ and $R^{1B}$ represent an organic group having 1 to 10 carbon atoms; b0, b1 and b2 represent an integer of 0 or more and b0+b1+2×b2 is the same number as the number determined by valency of M; and M is an element belonging to groups of III, IV, or V in a periodic table except for carbon.

The composition for forming a resist underlayer film can provide a resist underlayer film having a sufficient etching selectivity relative to an organic film and a silicon-containing film, in addition to favorable pattern adhesiveness relative to fine pattern, in a 2-layer structure composed of a silicon-containing compound and a metal-containing compound.

Each component will be described in detail, but a component used in the present invention is not restricted to the following examples.

Component (A)

Illustrative example of a raw material of a component (A) contained in the composition for forming a resist underlayer film of the present invention includes a silicon compound represented by the following general formula (A-1),

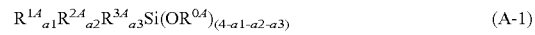

$$R^{1A}{}_{a1}R^{2A}{}_{a2}R^{3A}{}_{a3}Si(OR^{OA})_{(4-a1-a2-a3)} \qquad (A-1)$$

wherein, $R^{OA}$ represents a hydrocarbon group having 1 to 6 carbon atoms; any one of more of $R^{1A}$, $R^{2A}$ and $R^{3A}$ is an organic group having nitrogen atom, sulfur atom, phosphorus atom, or iodine atom, and the other(s) are a hydrogen atom or a monovalent organic group having 1 to 30 carbon atoms; and a1, a2 and a3 represent 0 or 1 and satisfy $1 \leq a1+a2+a3 \leq 3$.

The above silicon compound has 1 to 3 hydrolyzable groups: $OR^{OA}$ on silicon atom. $R^{OA}$ in $OR^{OA}$ represents a hydrocarbon group having 0 to 6 carbon atoms, and illustrative example thereof includes methyl group, ethyl group, n-propyl group, iso-propyl group, n-butyl group, iso-butyl group, sec-butyl group, tert-butyl group, n-pentyl group, cyclopentyl group, n-hexyl group, cyclohexyl group, and phenyl group.

The above silicon compound has an organic group represented by $R^{1A}$, $R^{2A}$ and $R^{3A}$ on silicon atom, and any one or more thereof is an organic group having nitrogen atom, sulfur atom, phosphorus atom or iodine atom, and other other(s) are a hydrogen atom or a monovalent organic group having 1 to 30 carbon atoms.

The organic group having nitrogen atom, sulfur atom, phosphorus atom, or iodine atom is preferably an organic group containing tertiary sulfonium, secondary iodonium, quaternary phosphonium, or quaternary ammonium having non-nucleophilic counter anion, and illustrative example of the organic group containing the quaternary ammonium having the non-nucleophilic counter anion includes the one represented by the following general formula.

In the following formula, (Si) indicates the position at which Si is bonded,

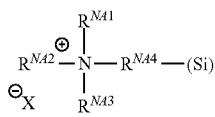

wherein, each of $R^{NA1}$, $R^{NA2}$ and $R^{NA3}$ represents a linear, a branched, or a cyclic alkyl group, alkenyl group, oxoalkyl group or oxoalkenyl group having 1 to 20 carbon atoms, a substituted or an unsubstituted aryl group having 6 to 20 carbon atoms, or an aralkyl group or an aryloxyalkyl group having 7 to 20 carbon atoms, and part or all of a hydrogen atom of these groups may be substituted by an alkoxy group, an amino group, an alkylamino group and so on. $R^{NA1}$ and $R^{NA2}$ may form a ring with a nitrogen atom with which they are bonded, and when a ring is formed, each of $R^{NA1}$ and $R^{NA2}$ represents an alkylene group having 1 to 6 carbon atoms. $R^{NA4}$ represents a linear, a branched, or a cyclic alkylene group or alkenylene group having 1 to 20 carbon atoms, a substituted or an unsubstituted arylene group having 6 to 20 carbon atoms, and part or all of a hydrogen atom of these groups may be substituted by an alkoxy group, an amino group, an alkylamino group and so on.

Illustrative example of $X^-$ includes hydroxide ion, formic acid ion, acetic acid ion, propionic acid ion, butanoic acid ion, pentanoic acid ion, hexanoic acid ion, heptanoic acid ion, octanoic acid ion, nonanoic acid ion, decanoic acid ion, oleic acid ion, stearic acid ion, linoleic acid ion, linolenic acid ion, benzoic acid ion, p-methylbenzoic acid ion, p-t-butylbenzoic acid ion, phthalic acid ion, isophthalic acid ion, terephthalic acid ion, salicylic acid ion, trifluoroacetic acid ion, monochloroacetic acid ion, dichloroacetic acid ion, trichioro- acetic acid ion, nitric acid ion, chloric acid ion, perchloric acid ion, bromic acid ion, iodic acid ion, oxalic acid ion, malonic acid ion, methylmalonic acid ion, ethylmalonic acid ion, propylmalonic acid ion, butylmalonic acid ion, dimethylmalonic acid ion, diethylmalonic acid ion, succinic acid ion, methylsuccinic acid ion, glutaric acid ion, adipic acid ion, itaconic acid ion, maleic acid ion, fumaric acid ion, citraconic acid ion, citric acid ion, and carbonate ion.

Specifically, the following structural formulae can be an illustrative example.

$X^-$ is not described in the following structural formulae.

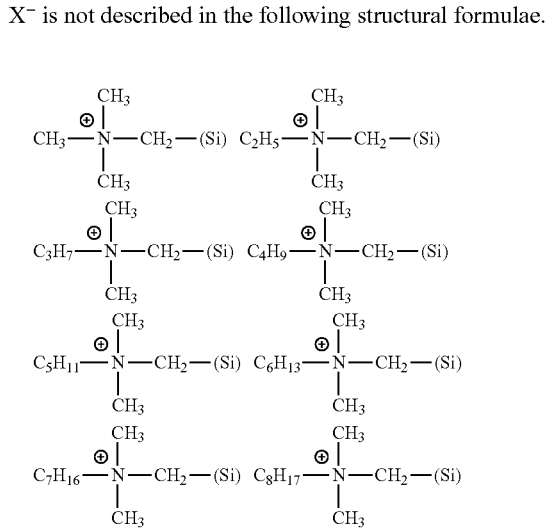

-continued

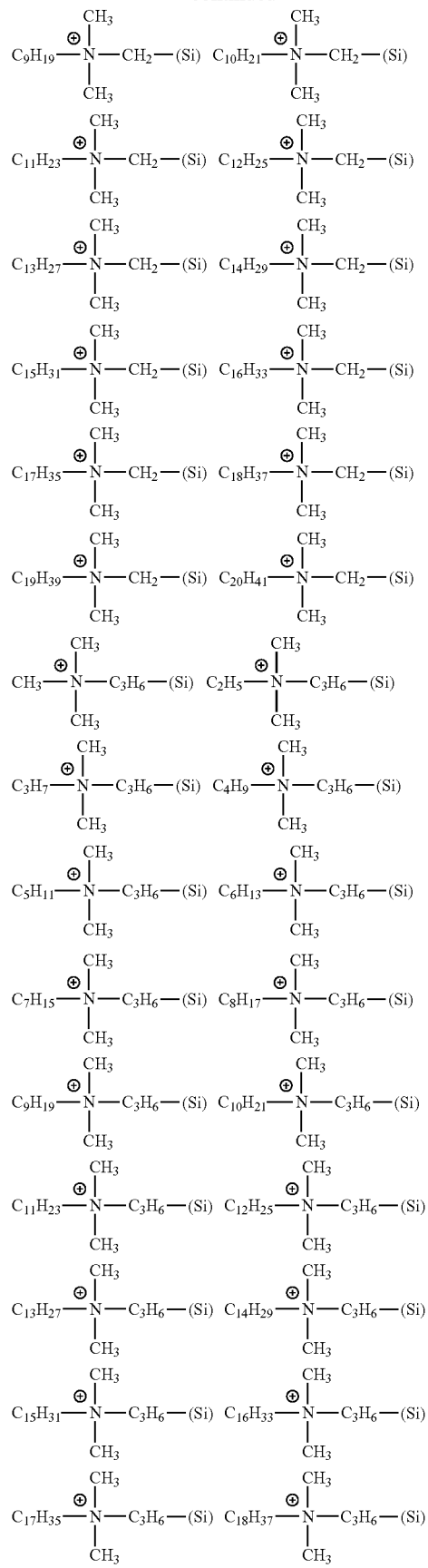

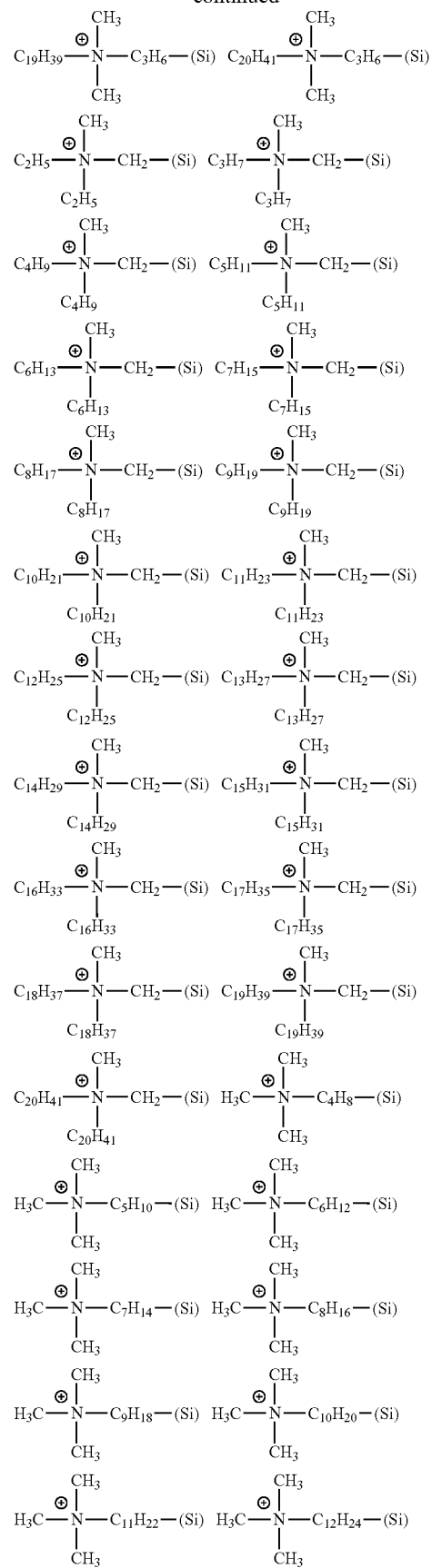
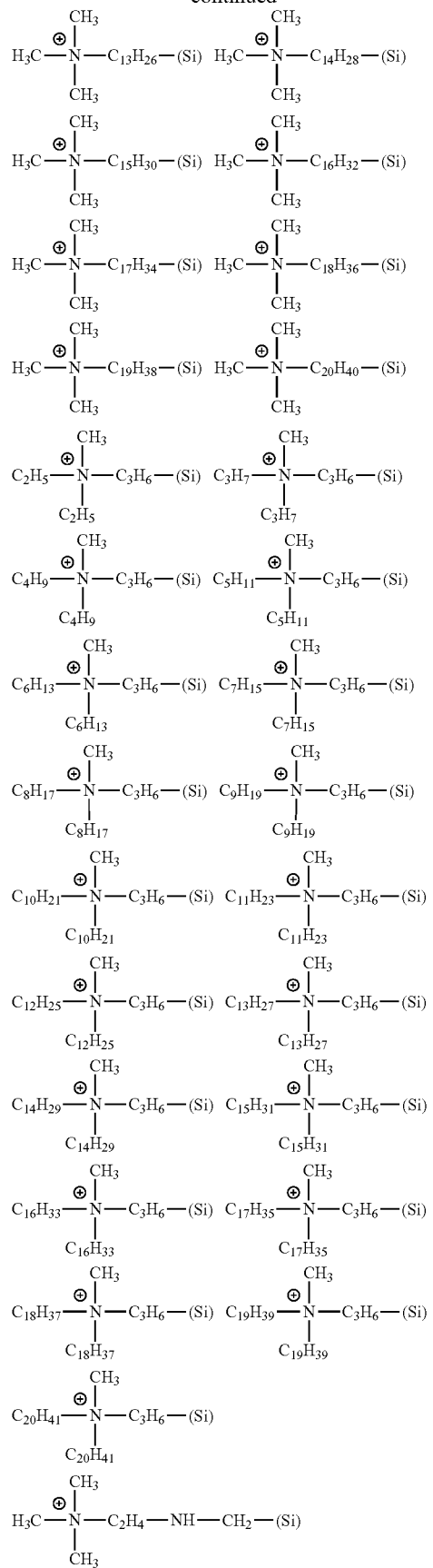

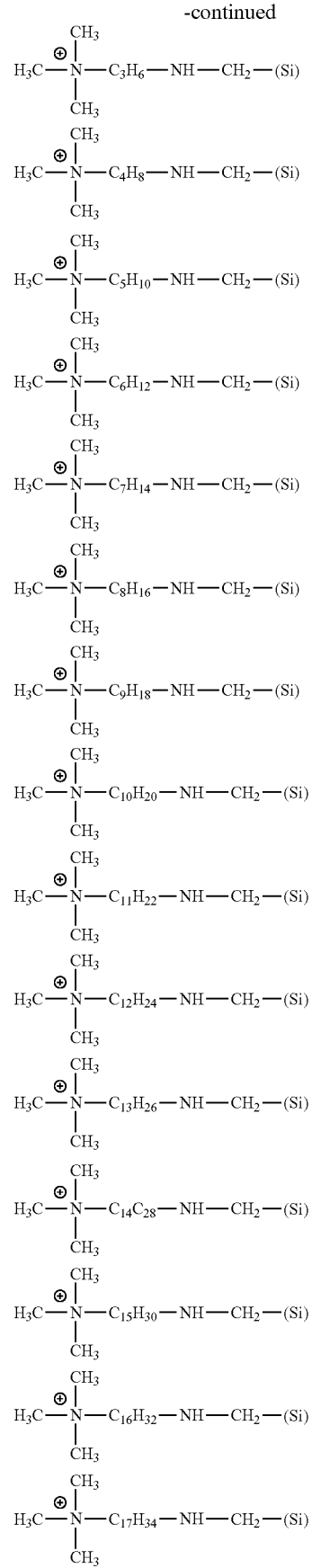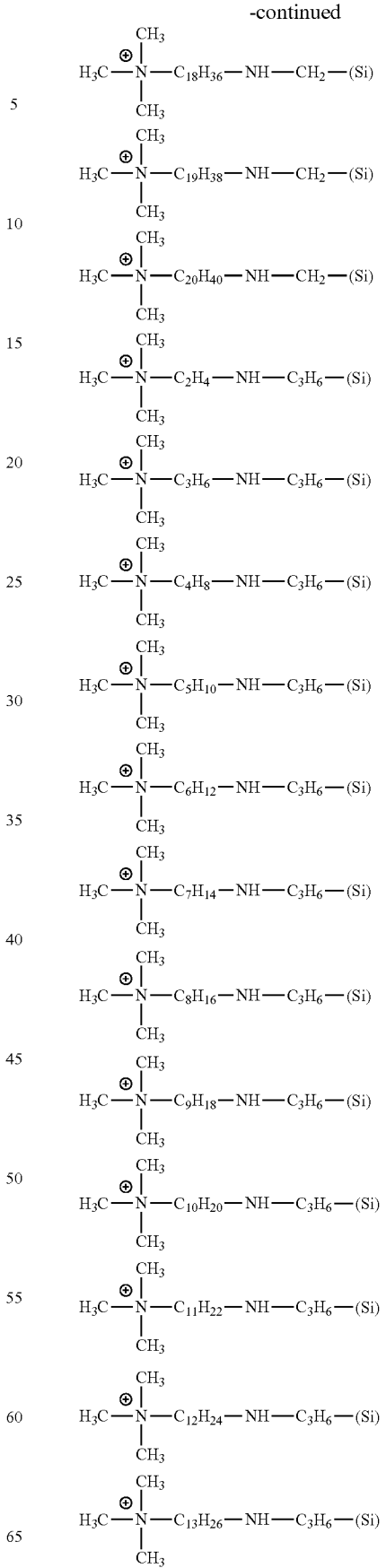

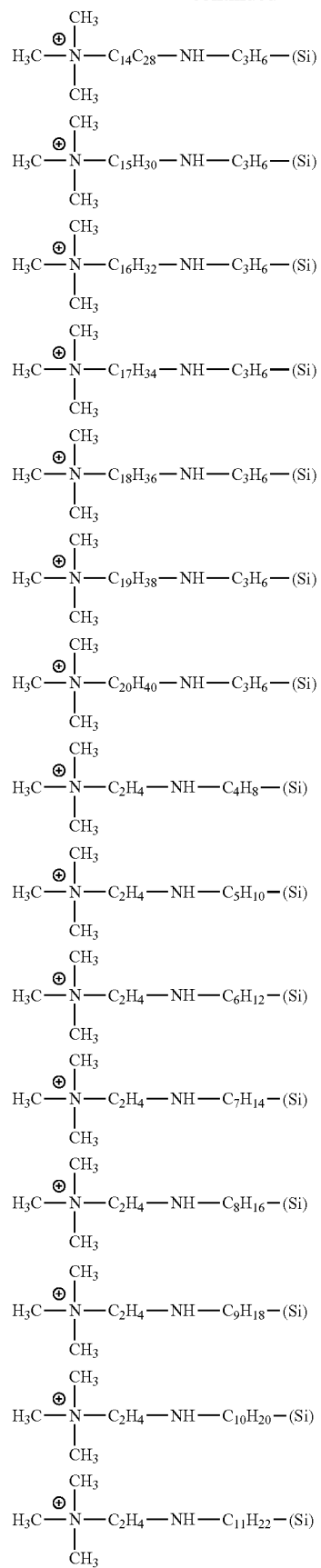
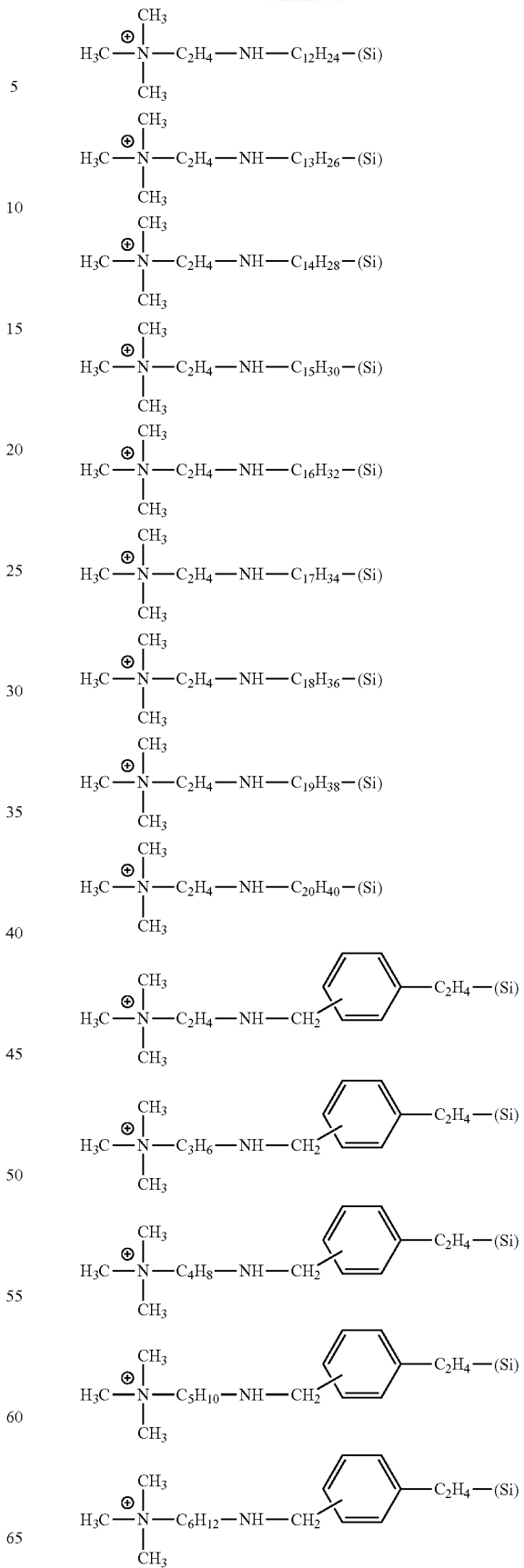

-continued
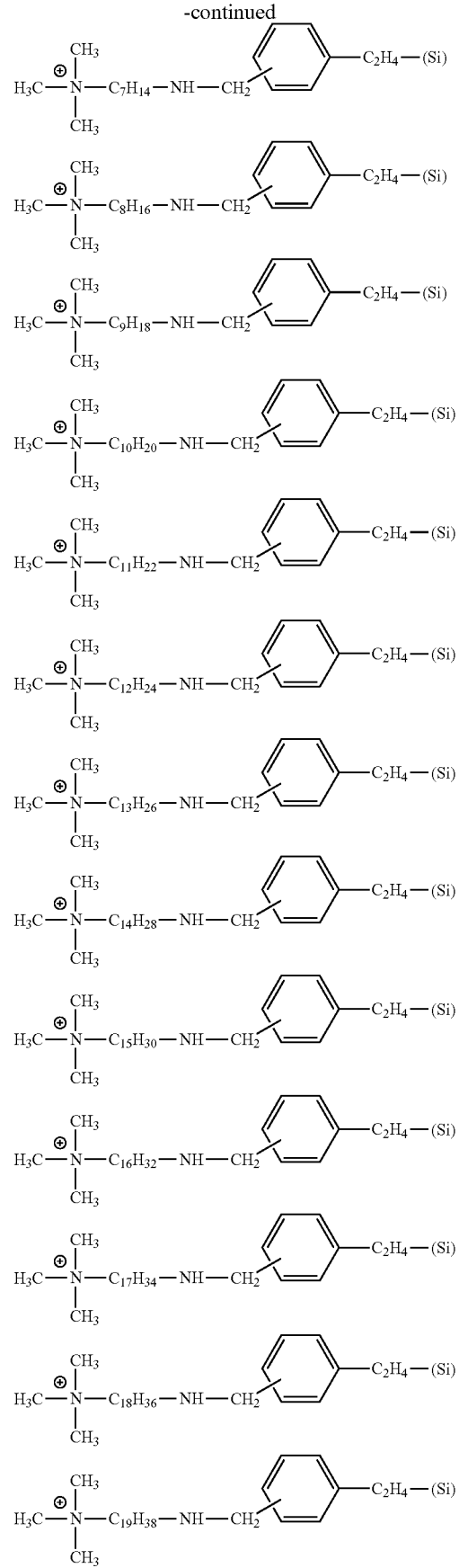
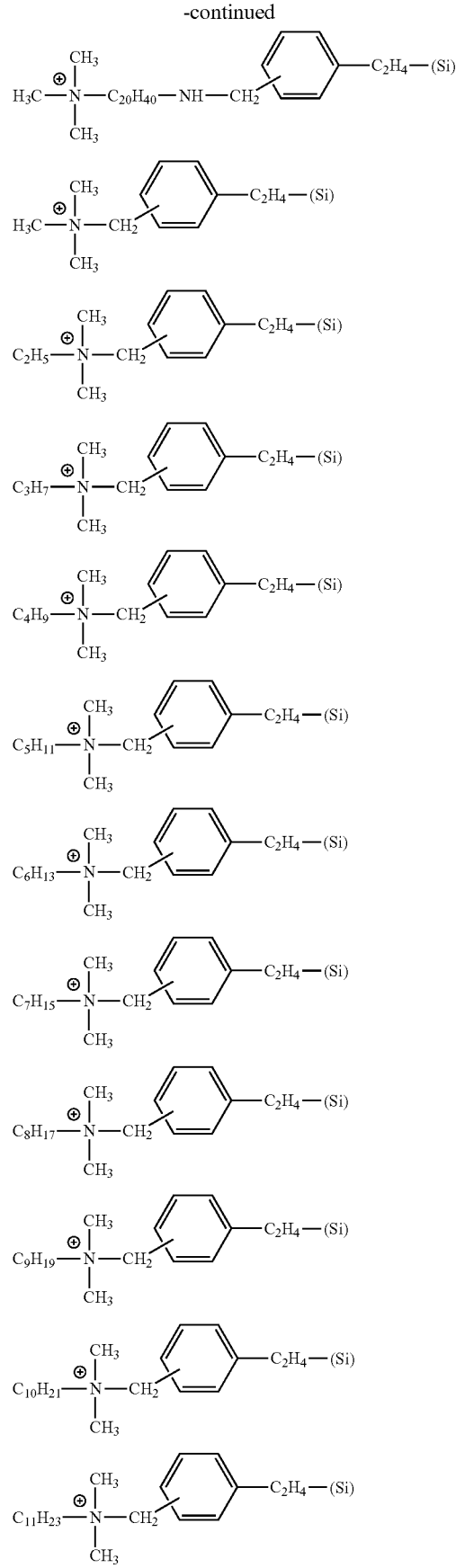

-continued
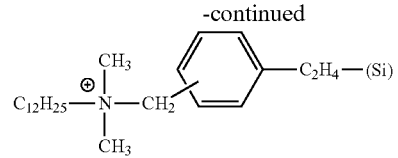
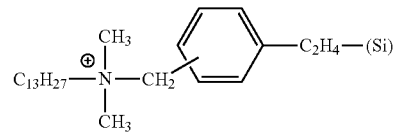
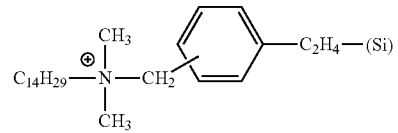
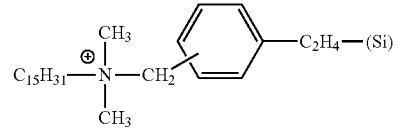
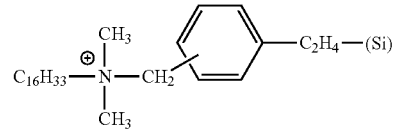
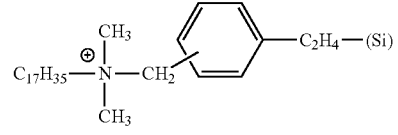
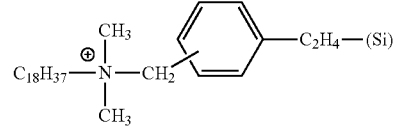
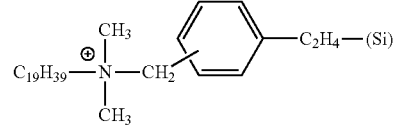
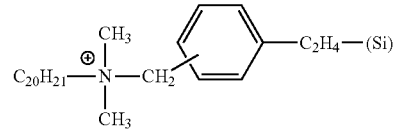
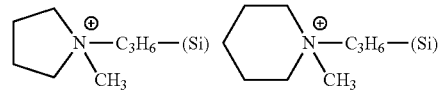
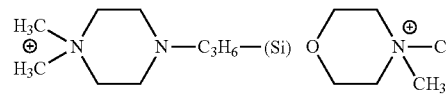
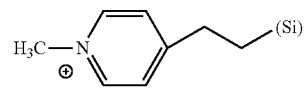
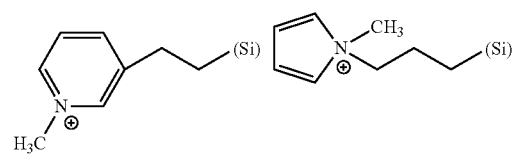
-continued
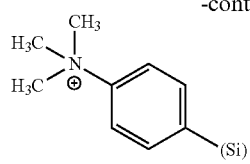
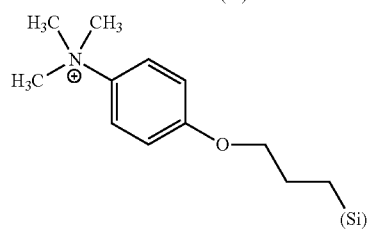
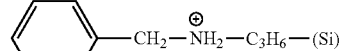
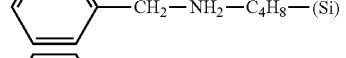
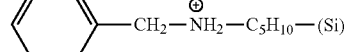
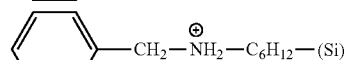
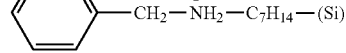
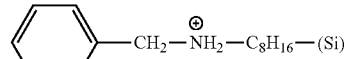
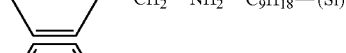
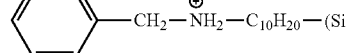
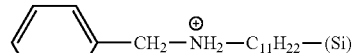
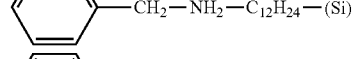
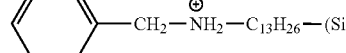
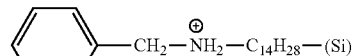

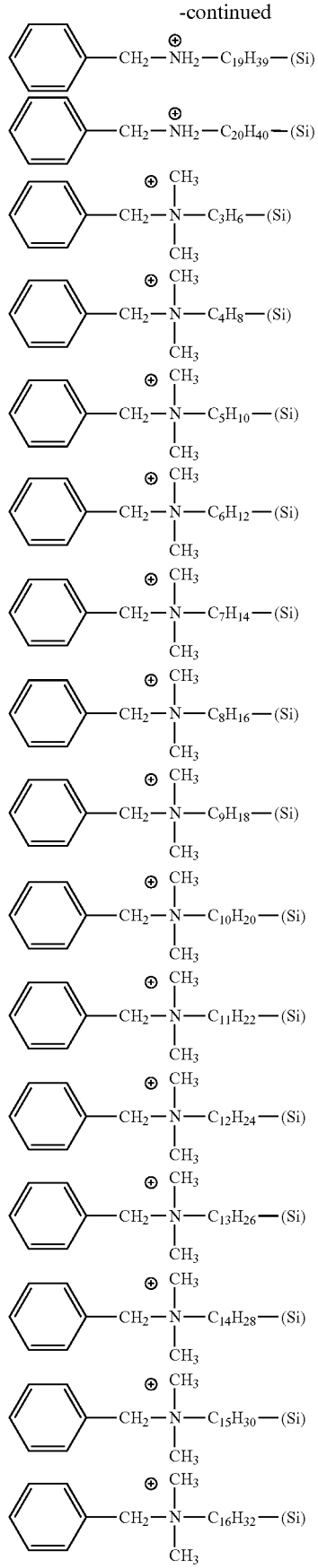
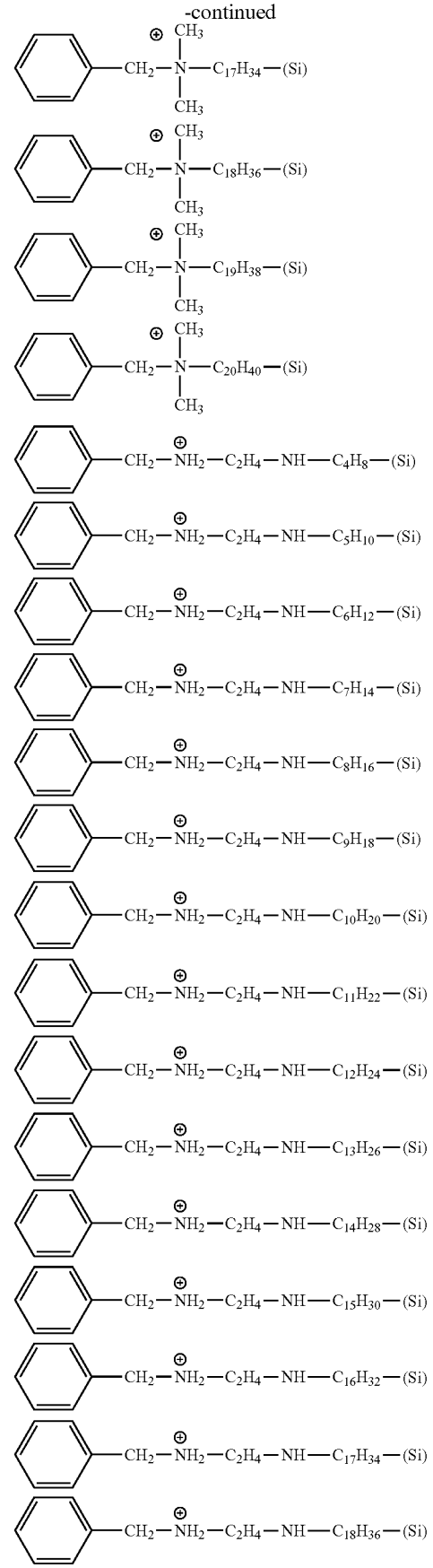

-continued
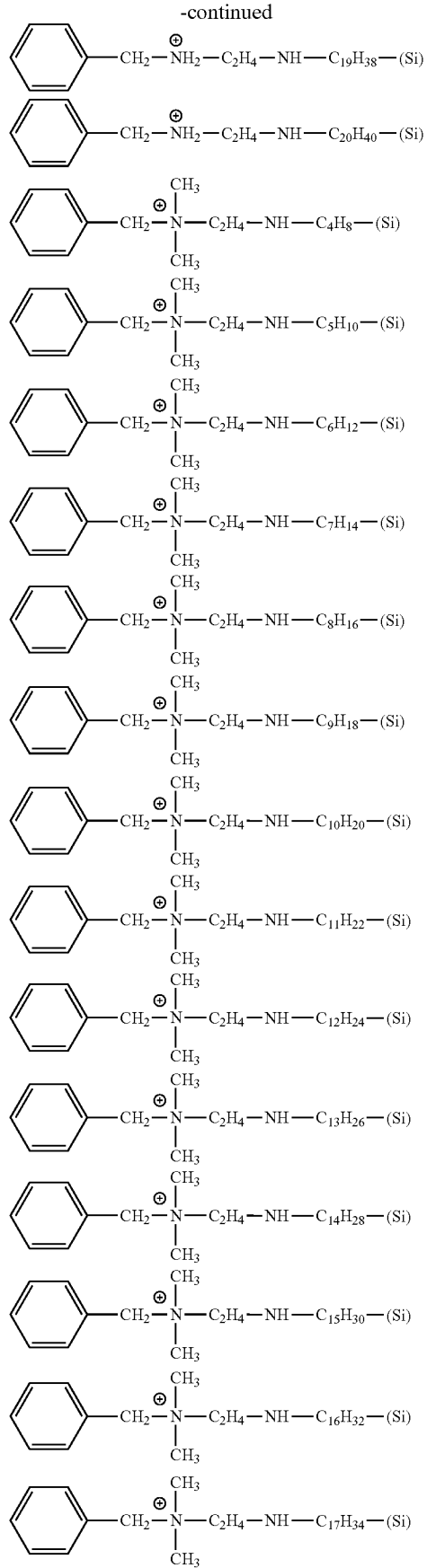
-continued
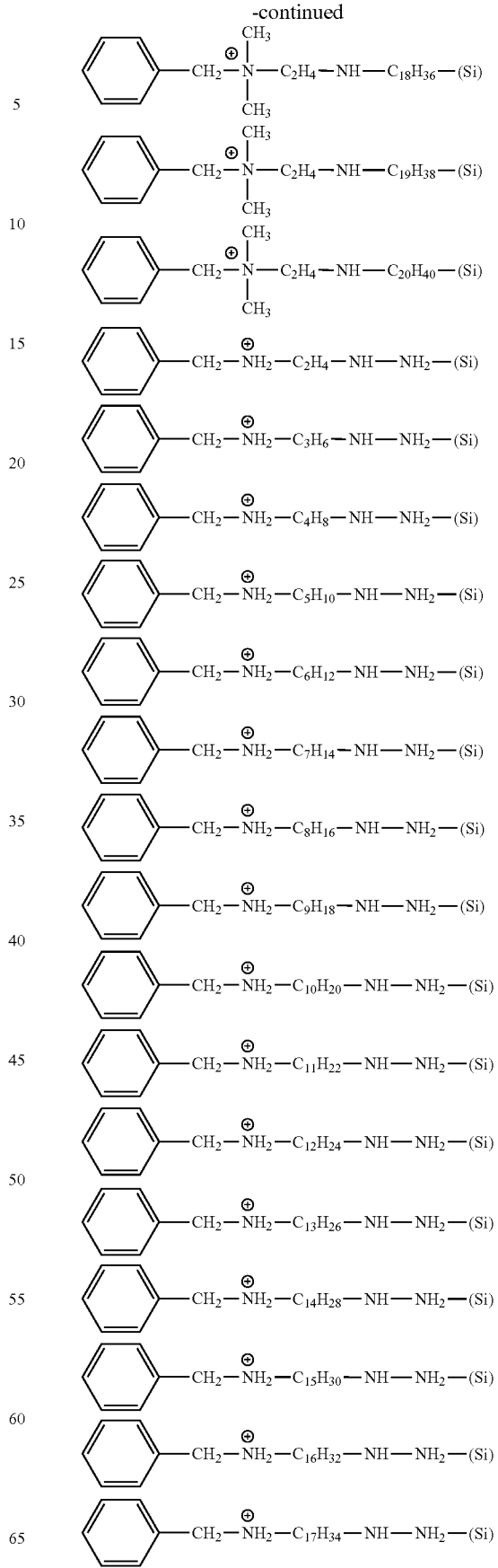

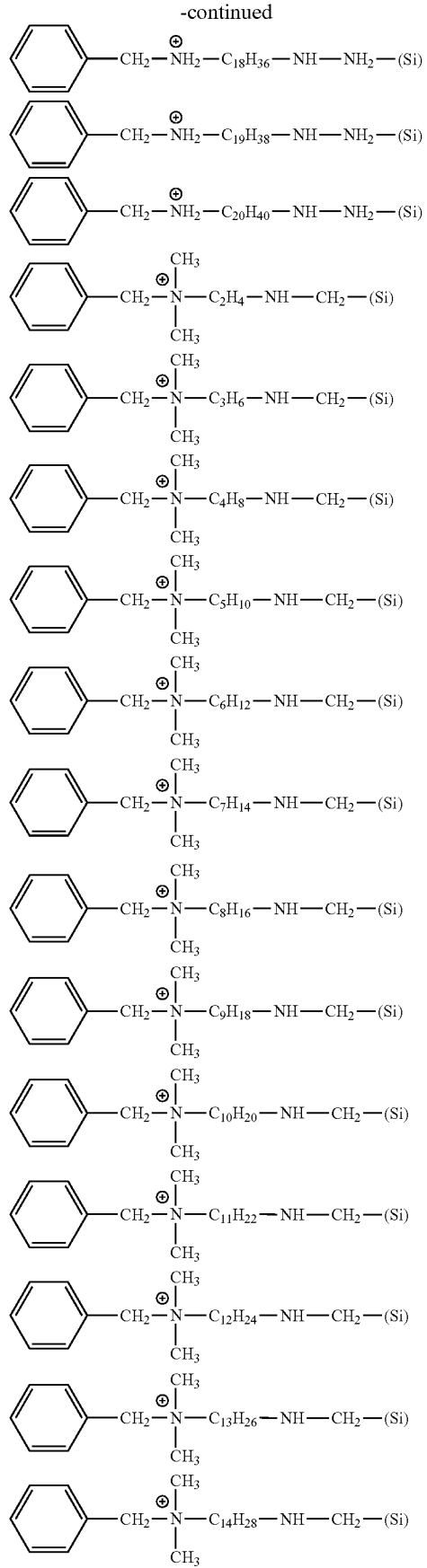
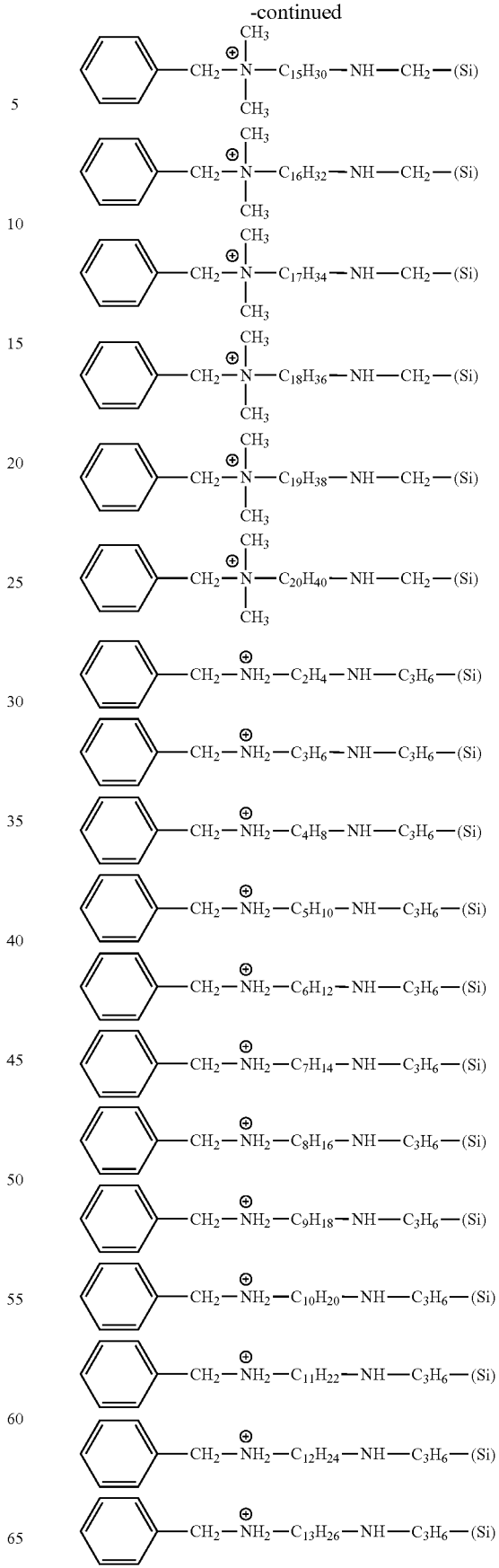

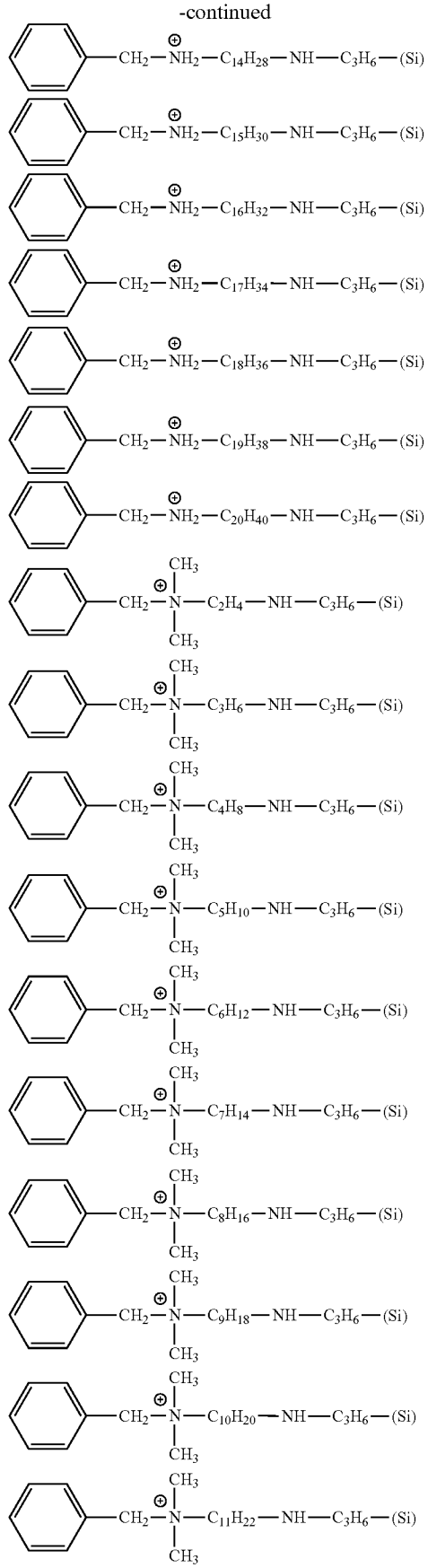

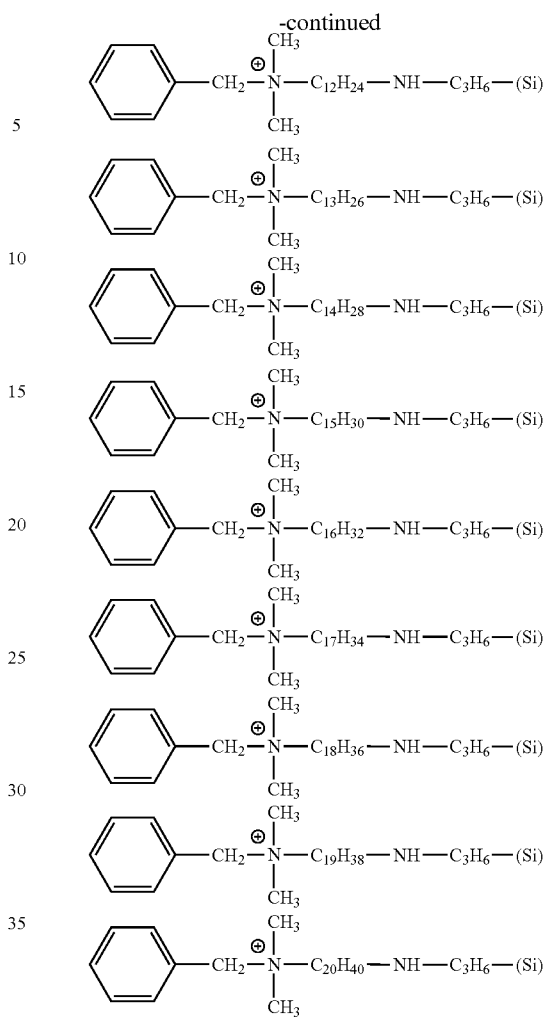

Illustrative example of the organic group containing tertiary sulfonium having non-nucleophilic counter anion includes the one represented by the following general formula.

$X^-$ is the same as before,

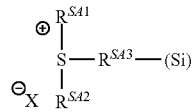

wherein, each of $R^{SA1}$ and $R^{SA2}$ represents a linear, a branched, or a cyclic alkyl group, alkenyl group, oxoalkyl group, or oxoalkenyl group having 1 to 20 carbon atoms, a substituted or an unsubstituted aryl group having 6 to 20 carbon atoms, or an aralkyl group or an aryloxyalkyl group having 7 to 20 carbon atoms, and part or all of a hydrogen atom of these groups may be substituted by an alkoxy group, an amino group, an alkylamino group, a halogen atom and so on. $R^{SA1}$ and $R^{SA2}$ may form a ring with a sulfur atom with which $R^{SA1}$ and $R^{SA2}$ are bonded, and when a ring is formed, each of $R^{SA1}$ and $R^{SA2}$ represents an alkylene group having 1 to 6 carbon atoms. $R^{SA3}$ represents a linear, a branched, or a cyclic alkylene group, alkenylene group having 1 to 20 carbon atoms, a substituted or an unsubstituted arylene group having 6 to 20 carbon atoms, and part or all of a hydrogen atom of these groups may be substituted by an alkoxy group, an amino group, an alkylamino group and so on.

Specifically, the following structural formulae can be illustrated.
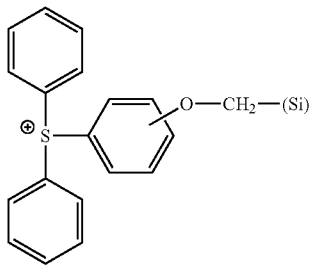
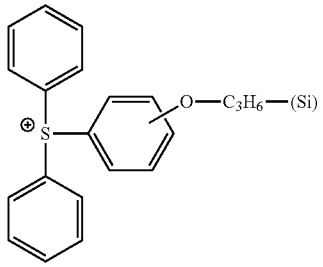
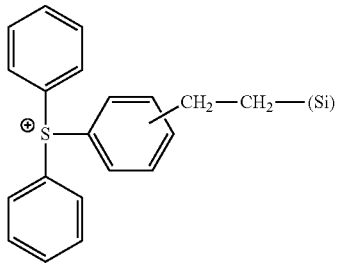
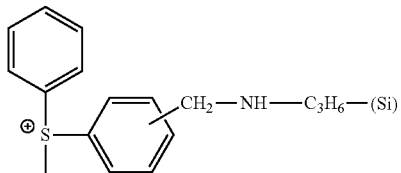
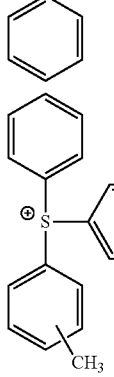
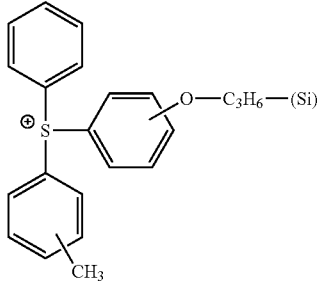
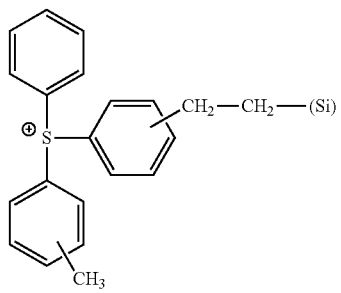
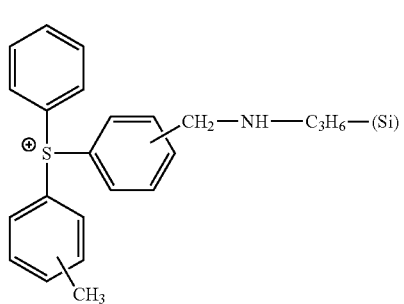
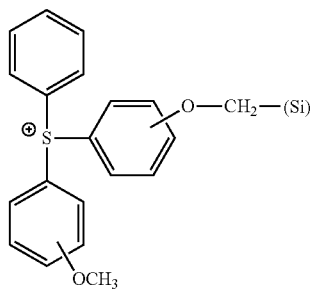
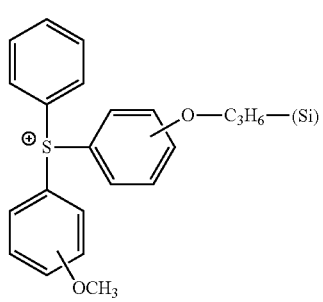
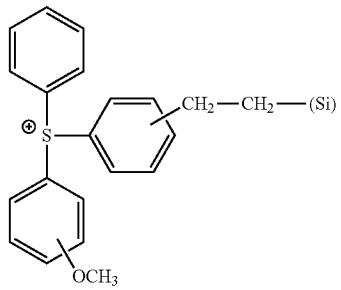

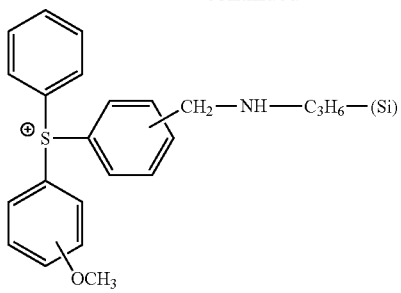
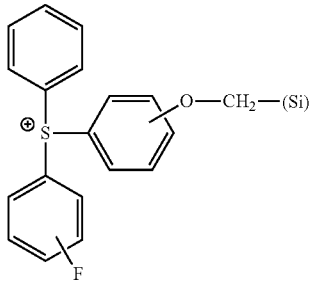
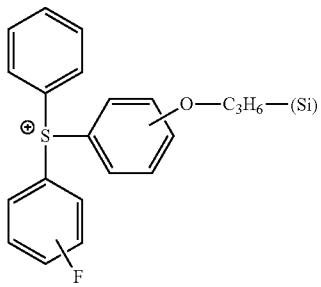
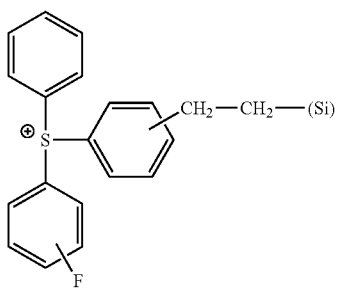
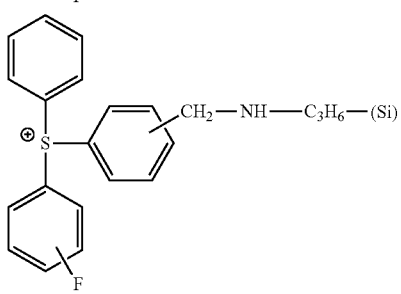
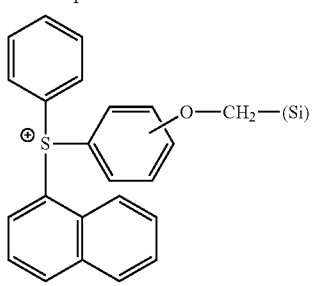

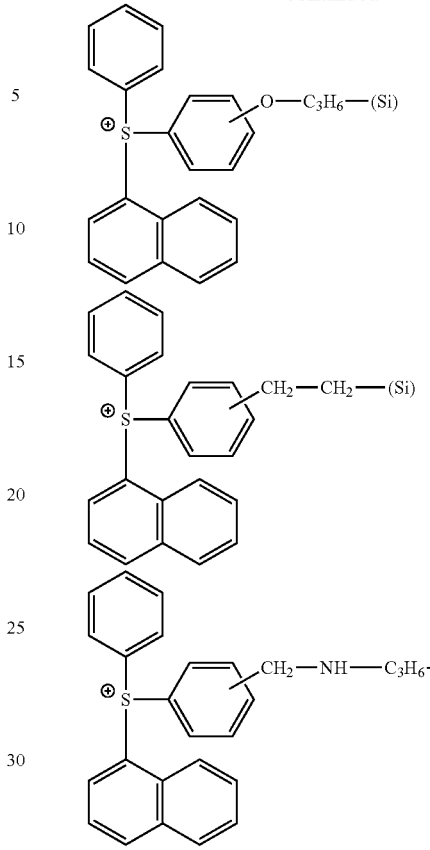

Illustrative example of the organic group containing quaternary phosphonium having non-nucleophilic counter anion includes the one represented by the following general formula.

$X^-$ is the same as before,

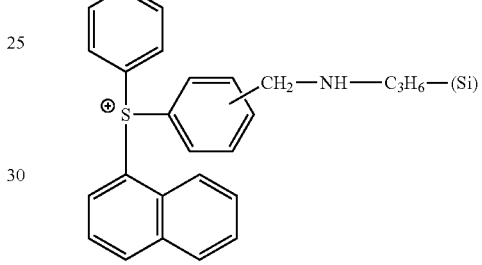

wherein, each of $R^{PA1}$, $R^{PA2}$ and $R^{PA3}$ represents a linear, a branched, or a cyclic alkyl group, alkenyl group, oxoalkyl group, or oxoalkenyl group having 1 to 20 carbon atoms, a substituted or an unsubstituted aryl group having 6 to 20 carbon atoms, or an aralkyl group or an aryloxyalkyl group having 7 to 20 carbon atoms, and part or all of a hydrogen atom of these groups may be substituted by an alkoxy group, an amino group, an alkylamino group, a halogen atom and so on. $R^{PA1}$ and $R^{PA2}$ may form a ring with a phosphorus atom with which $R^{PA1}$ and $R^{PA2}$ are bonded, and when a ring is formed, each of $R^{PA1}$ and $R^{PA2}$ represents an alkylene group having 1 to 6 carbon atoms. $R^{PA4}$ represents a linear, a branched, or a cyclic alkylene group, alkenylene group having 1 to 20 carbon atoms, a substituted or an unsubstituted arylene group having 6 to 20 carbon atoms, and part or all of a hydrogen atom of these groups may be substituted by an alkoxy group, an amino group, an alkylamino group and so on.

Specifically, the following structural formulae can be illustrated.

33 34
-continued
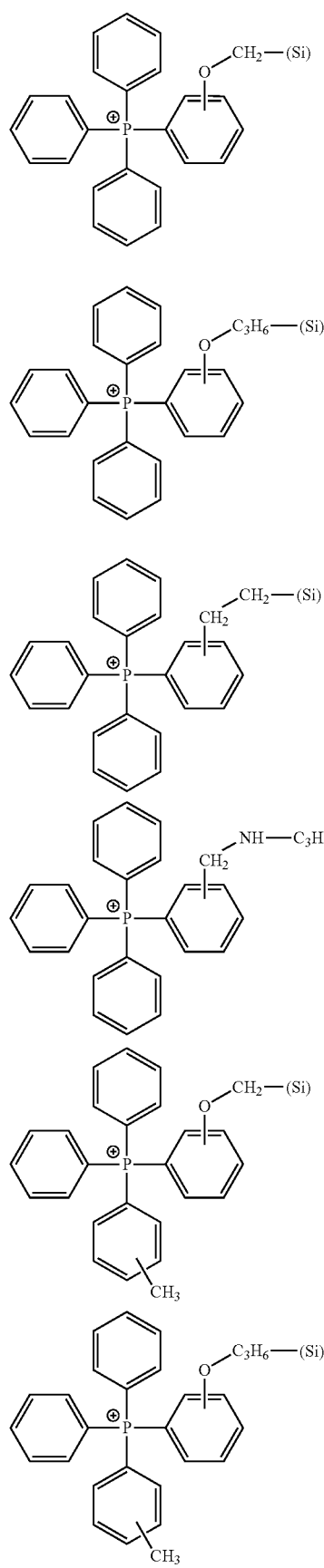
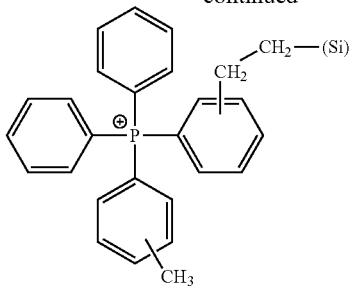
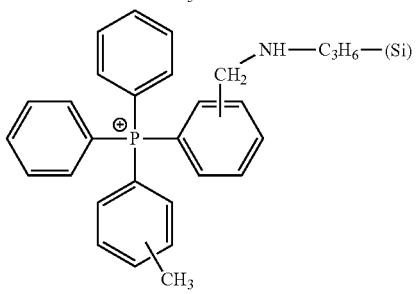
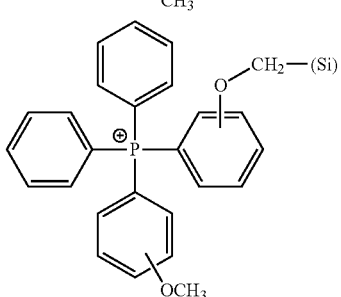
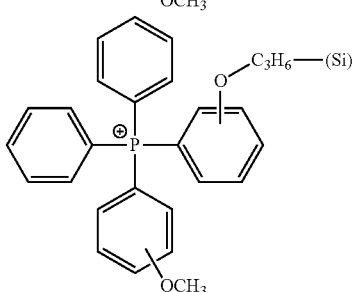
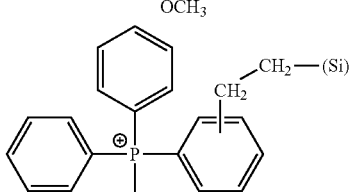
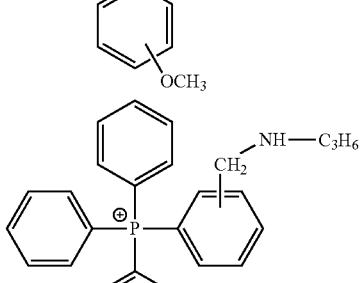
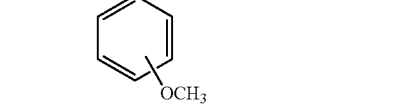

35
-continued
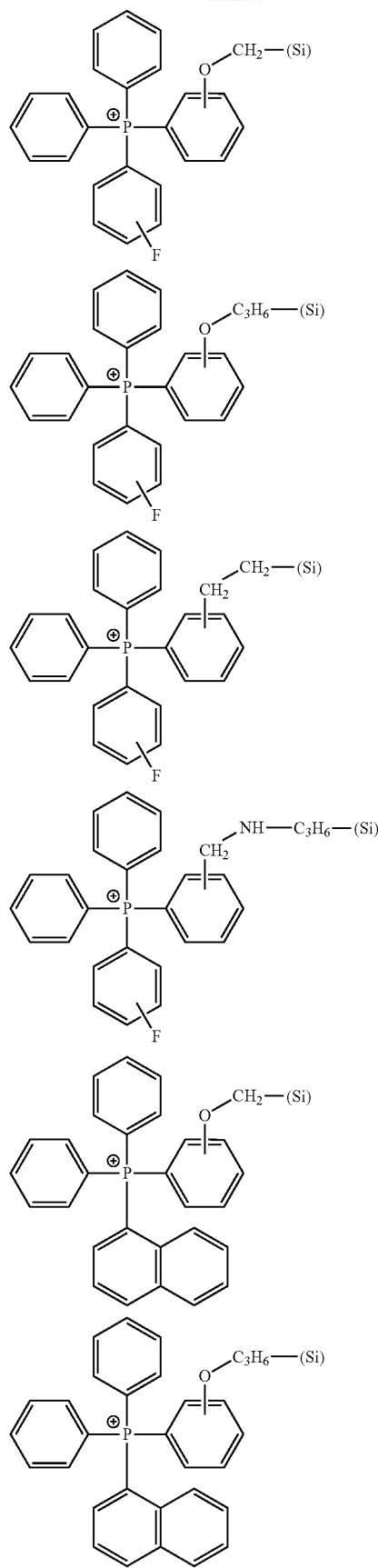
36
-continued
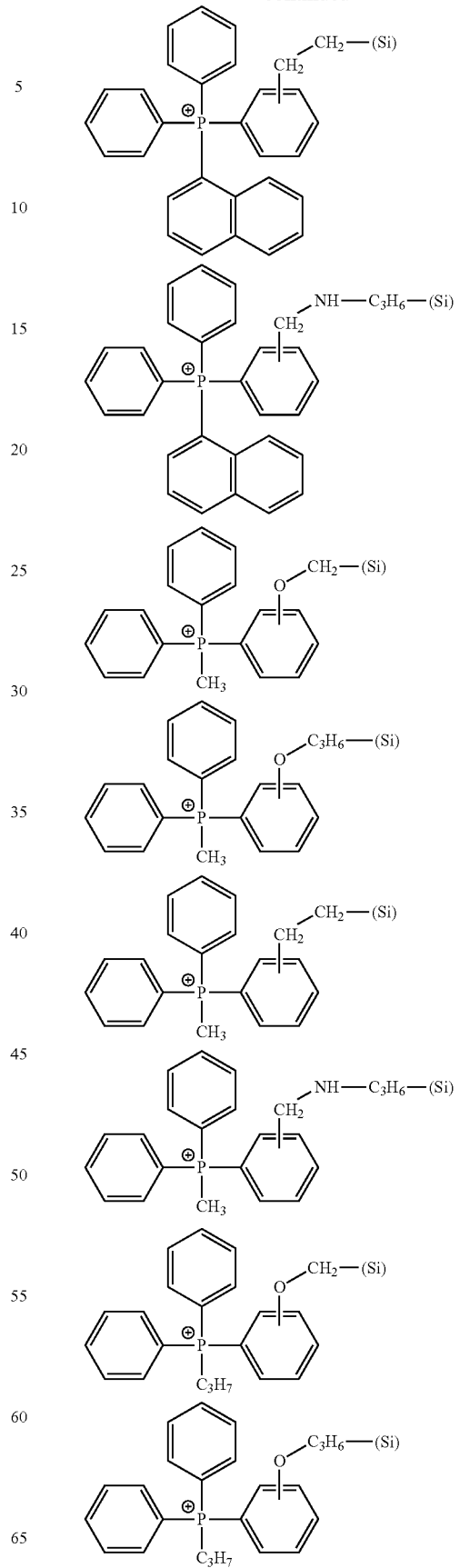

-continued

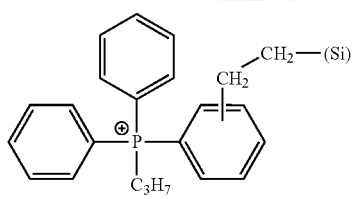
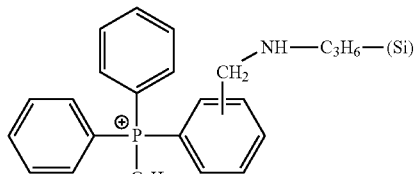
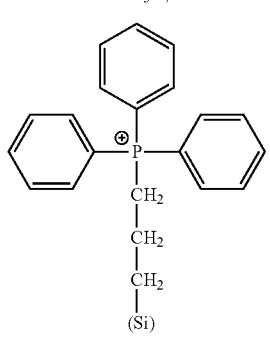
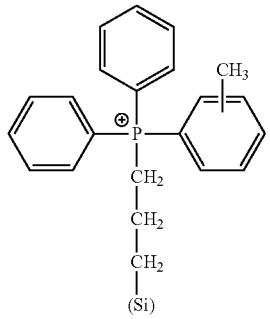
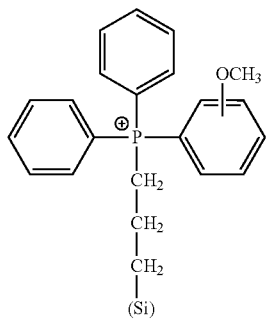
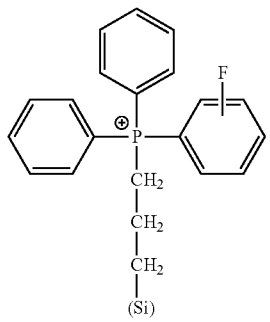

Illustrative example of the organic group containing secondary iodonium having non-nucleophilic counter anion includes the one represented by the following general formula.

$X^-$ is the same as before,

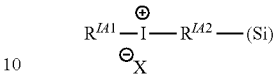

wherein, $R^{IA1}$ represents a linear, a branched, or a cyclic alkyl group, alkenyl group, oxoalkyl group, or oxoalkenyl group having 1 to 20 carbon atoms, a substituted or an unsubstituted aryl group having 6 to 20 carbon atoms, or an aralkyl group or an aryloxyalkyl group having 7 to 20 carbon atoms, and part or all of a hydrogen atom of these groups may be substituted by an alkoxy group, an amino group, an alkylamino group, a halogen atom and so on. $R^{IA2}$ represents a linear, a branched, or a cyclic alkylene group, alkenylene group having 1 to 20 carbon atoms, a substituted or an unsubstituted arylene group having 6 to 20 carbon atoms, and part or all of a hydrogen atom of these groups may be substituted by an alkoxy group, an amino group, an alkylamino group and so on.

Specifically, the following structural formulae can be illustrated.

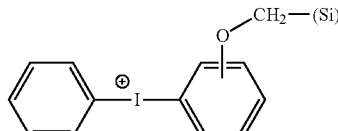
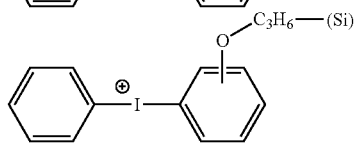
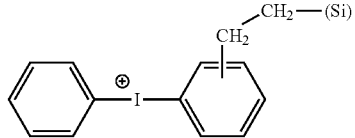
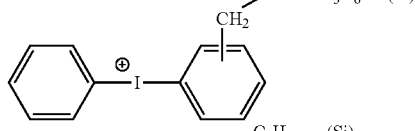
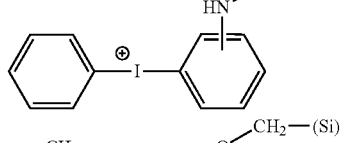
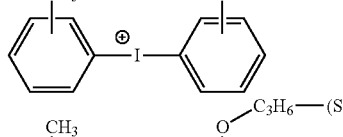
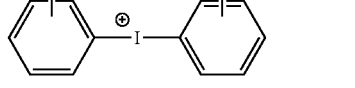

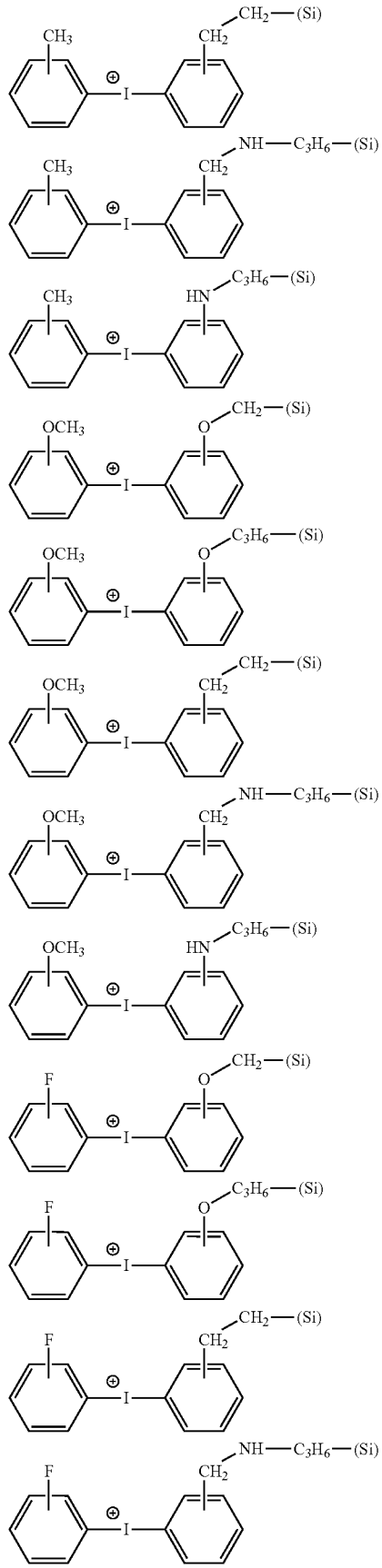

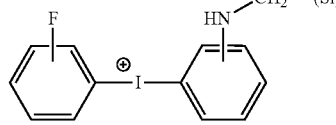

Illustrative example of the organic group having nitrogen atom includes primary amine, secondary amine, tertiary amine, or heterocycle. Illustrative example of the organic group is shown as follows.

| | |
|---|---|
| $H_2N-C_3H_6-(Si)$ | $H_2N-C_4H_8-(Si)$ |
| $H_2N-C_5H_{10}-(Si)$ | $H_2N-C_6H_{12}-(Si)$ |
| $H_2N-C_7H_{14}-(Si)$ | $H_2N-C_8H_{16}-(Si)$ |
| $H_2N-C_9H_{18}-(Si)$ | $H_2N-C_{10}H_{20}-(Si)$ |
| $H_2N-C_{11}H_{22}-(Si)$ | $H_2N-C_{12}H_{24}-(Si)$ |
| $H_2N-C_{13}H_{26}-(Si)$ | $H_2N-C_{14}H_{28}-(Si)$ |
| $H_2N-C_{15}H_{30}-(Si)$ | $H_2N-C_{16}H_{32}-(Si)$ |
| $H_2N-C_{17}H_{34}-(Si)$ | $H_2N-C_{18}H_{36}-(Si)$ |
| $H_2N-C_{19}H_{38}-(Si)$ | $H_2N-C_{20}H_{40}-(Si)$ |
| $H_3C-NH-CH_2-(Si)$ | $C_2H_5-NH-CH_2-(Si)$ |
| $C_3H_7-NH-CH_2-(Si)$ | $C_4H_9-NH-CH_2-(Si)$ |
| $C_5H_{11}-NH-CH_2-(Si)$ | $C_6H_{13}-NH-CH_2-(Si)$ |
| $C_7H_{16}-NH-CH_2-(Si)$ | $C_8H_{17}-NH-CH_2-(Si)$ |
| $C_9H_{19}-NH-CH_2-(Si)$ | $C_{10}H_{21}-NH-CH_2-(Si)$ |
| $C_{11}H_{23}-NH-CH_2-(Si)$ | $C_{12}H_{25}-NH-CH_2-(Si)$ |
| $C_{13}H_{27}-NH-CH_2-(Si)$ | $C_{14}H_{29}-NH-CH_2-(Si)$ |
| $C_{15}H_{31}-NH-CH_2-(Si)$ | $C_{16}H_{33}-NH-CH_2-(Si)$ |
| $C_{17}H_{35}-NH-CH_2-(Si)$ | $C_{18}H_{37}-NH-CH_2-(Si)$ |
| $C_{19}H_{39}-NH-CH_2-(Si)$ | $C_{20}H_{41}-NH-CH_2-(Si)$ |
| $H_3C-NH-C_3H_6-(Si)$ | $C_2H_5-NH-C_3H_6-(Si)$ |
| $C_3H_7-NH-C_3H_6-(Si)$ | $C_4H_9-NH-C_3H_6-(Si)$ |
| $C_5H_{11}-NH-C_3H_6-(Si)$ | $C_6H_{13}-NH-C_3H_6-(Si)$ |
| $C_7H_{15}-NH-C_3H_6-(Si)$ | $C_8H_{17}-NH-C_3H_6-(Si)$ |
| $C_9H_{19}-NH-C_3H_6-(Si)$ | $C_{10}H_{21}-NH-C_3H_6-(Si)$ |
| $C_{11}H_{23}-NH-C_3H_6-(Si)$ | $C_{12}H_{25}-NH-C_3H_6-(Si)$ |
| $C_{13}H_{27}-NH-C_3H_6-(Si)$ | $C_{14}H_{29}-NH-C_3H_6-(Si)$ |
| $C_{15}H_{31}-NH-C_3H_6-(Si)$ | $C_{16}H_{33}-NH-C_3H_6-(Si)$ |
| $C_{17}H_{35}-NH-C_3H_6-(Si)$ | $C_{18}H_{37}-NH-C_3H_6-(Si)$ |
| $C_{19}H_{39}-NH-C_3H_6-(Si)$ | $C_{20}H_{41}-NH-C_3H_6-(Si)$ |
| $H_2N-C_2H_4-NH-CH_2-(Si)$ | |
| $H_2N-C_3H_6-NH-CH_2-(Si)$ | |
| $H_2N-C_4H_8-NH-CH_2-(Si)$ | |
| $H_2N-C_5H_{10}-NH-CH_2-(Si)$ | |
| $H_2N-C_6H_{12}-NH-CH_2-(Si)$ | |
| $H_2N-C_7H_{14}-NH-CH_2-(Si)$ | |

41

-continued

H$_2$N—C$_8$H$_{16}$—NH—CH$_2$—(Si)
H$_2$N—C$_9$H$_{18}$—NH—CH$_2$—(Si)
H$_2$N—C$_{10}$H$_{20}$—NH—CH$_2$—(Si)
H$_2$N—C$_{11}$H$_{22}$—NH—CH$_2$—(Si)
H$_2$N—C$_{12}$H$_{24}$—NH—CH$_2$—(Si)
H$_2$N—C$_{13}$H$_{26}$—NH—CH$_2$—(Si)
H$_2$N—C$_{14}$H$_{28}$—NH—CH$_2$—(Si)
H$_2$N—C$_{15}$H$_{30}$—NH—CH$_2$—(Si)
H$_2$N—C$_{16}$H$_{32}$—NH—CH$_2$—(Si)
H$_2$N—C$_{17}$H$_{34}$—NH—CH$_2$—(Si)
H$_2$N—C$_{18}$H$_{36}$—NH—CH$_2$—(Si)
H$_2$N—C$_{19}$H$_{38}$—NH—CH$_2$—(Si)
H$_2$N—C$_{20}$H$_{40}$—NH—CH$_2$—(Si)
H$_2$N—C$_2$H$_4$—NH—C$_3$H$_6$—(Si)
H$_2$N—C$_3$H$_6$—NH—C$_3$H$_6$—(Si)
H$_2$N—C$_4$H$_8$—NH—C$_3$H$_6$—(Si)
H$_2$N—C$_5$H$_{10}$—NH—C$_3$H$_6$—(Si)
H$_2$N—C$_6$H$_{12}$—NH—C$_3$H$_6$—(Si)
H$_2$N—C$_7$H$_{14}$—NH—C$_3$H$_6$—(Si)
H$_2$N—C$_8$H$_{16}$—NH—C$_3$H$_6$—(Si)
H$_2$N—C$_9$H$_{18}$—NH—C$_3$H$_6$—(Si)
H$_2$N—C$_{10}$H$_{20}$—NH—C$_3$H$_6$—(Si)
H$_2$N—C$_{11}$H$_{22}$—NH—C$_3$H$_6$—(Si)
H$_2$N—C$_{12}$H$_{24}$—NH—C$_3$H$_6$—(Si)
H$_2$N—C$_{13}$H$_{26}$—NH—C$_3$H$_6$—(Si)
H$_2$N—C$_{14}$H$_{28}$—NH—C$_3$H$_6$—(Si)
H$_2$N—C$_{15}$H$_{30}$—NH—C$_3$H$_6$—(Si)
H$_2$N—C$_{16}$H$_{32}$—NH—C$_3$H$_6$—(Si)
H$_2$N—C$_{17}$H$_{34}$—NH—C$_3$H$_6$—(Si)
H$_2$N—C$_{18}$H$_{36}$—NH—C$_3$H$_6$—(Si)
H$_2$N—C$_{19}$H$_{38}$—NH—C$_3$H$_6$—(Si)
H$_2$N—C$_{20}$H$_{40}$—NH—C$_3$H$_6$—(Si)
H$_2$N—C$_2$H$_4$—NH—C$_3$H$_6$—(Si)
H$_2$N—C$_2$H$_4$—NH—C$_4$H$_8$—(Si)
H$_2$N—C$_2$H$_4$—NH—C$_5$H$_{10}$—(Si)
H$_2$N—C$_2$H$_4$—NH—C$_6$H$_{12}$—(Si)
H$_2$N—C$_2$H$_4$—NH—C$_7$H$_{14}$—(Si)
H$_2$N—C$_2$H$_4$—NH—C$_8$H$_{16}$—(Si)
H$_2$N—C$_2$H$_4$—NH—C$_9$H$_{18}$—(Si)
H$_2$N—C$_2$H$_4$—NH—C$_{10}$H$_{20}$—(Si)
H$_2$N—C$_2$H$_4$—NH—C$_{11}$H$_{22}$—(Si)
H$_2$N—C$_2$H$_4$—NH—C$_{12}$H$_{24}$—(Si)
H$_2$N—C$_2$H$_4$—NH—C$_{13}$H$_{26}$—(Si)
H$_2$N—C$_2$H$_4$—NH—C$_{14}$H$_{28}$—(Si)

42

-continued

H$_2$N—C$_2$H$_4$—NH—C$_{15}$H$_{30}$—(Si)
H$_2$N—C$_2$H$_4$—NH—C$_{16}$H$_{32}$—(Si)
H$_2$N—C$_2$H$_4$—NH—C$_{17}$H$_{34}$—(Si)
H$_2$N—C$_2$H$_4$—NH—C$_{18}$H$_{36}$—(Si)
H$_2$N—C$_2$H$_4$—NH—C$_{19}$H$_{38}$—(Si)
H$_2$N—C$_2$H$_4$—NH—C$_{20}$H$_{40}$—(Si)

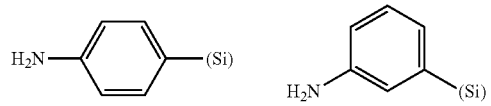
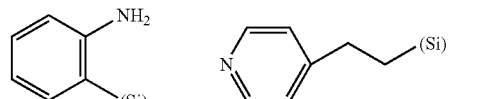
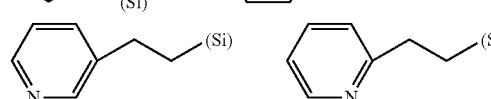
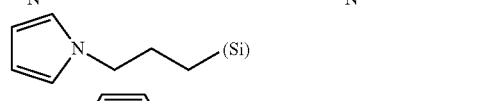
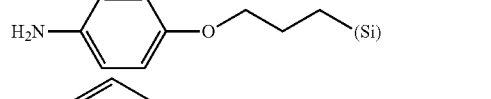
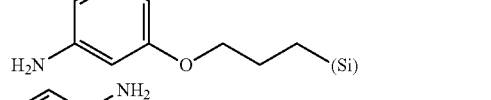
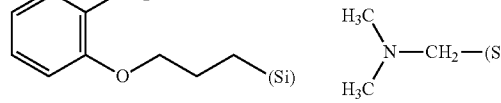
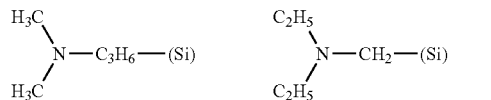
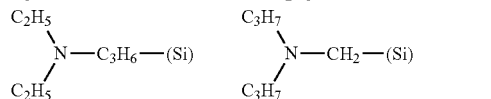
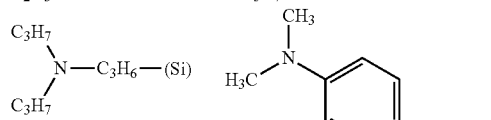
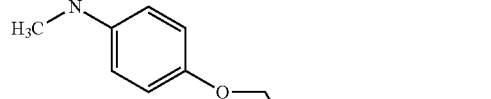
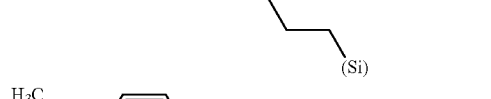
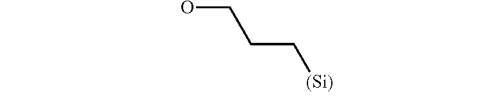

-continued

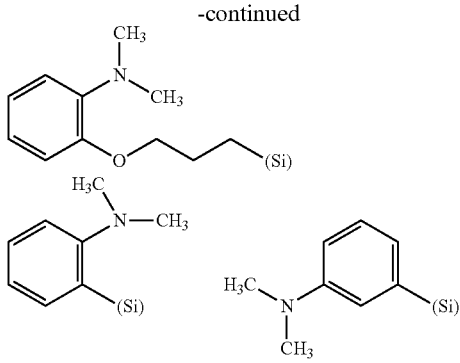

Illustrative example of the raw material of the component (A) includes a silicon compound represented by the following general formula (A-2),

wherein, $R^{4A}$ represents a hydrocarbon group having 1 to 6 carbon atoms; each of $R^{5A}$, $R^{6A}$ and $R^{7A}$ represents a hydrogen atom or a monovalent organic group having 1 to 30 carbon atoms; and a5, a6 and a7 represent 0 or 1 and satisfy $0 \leq a5+a6+a7 \leq 3$.

Illustrative example of the silicon compound includes trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, a cyclohexyltripropoxysilane, cyclobutyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyitripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamanthyltrimethoxysilane, adamanthyltriethoxysilane, adamanthyltripropoxysilane, adamanthyltriisopropoxysilane, phenyltrimethoxysilane, phenyltriethoxysilane, phenyltripropoxysilane, phenyltriisopropoxysilane, benzyitrimethoxysilane, benzyltriethoxysilane, benzyitripropoxysilane, benzyitriisopropoxysilane, tolyltrimethoxysilane, tolyltriethoxysilane, tolyltripropoxysilane, tolyltriisopropoxysilane, anisyltrimethoxysilane, anisyltriethoxysilane, anisyltripropoxysilane, anisyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-dibutyldimethoxysilane, di-sec-dibutyldiethoxysilane, di-sec-dibutyldipropoxysilane, di-sec-dibutyldiisopropoxysilane, di-t-dibutyldimethoxysilane, di-t-dibutyldiethoxysilane, di-t-dibutyldipropoxysilane, di-t-dibutyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienyipropyldipropoxysilane, dicyclopentadienylpropyldiisopropoxysilane, bis(bicycloheptenyl) dimethoxysilane, bis(bicycloheptenyl) diethoxysilane, bis(bicycloheptenyl) dipropoxysilane, bis(bicycloheptenyl) diisopropoxysilane, bis(bicycloheptyl) dimethoxysilane, bis(bicycloheptyl) diethoxysilane, bis(bicycloheptyl) dipropoxysilane, bis(bicycloheptyl) diisopropoxysilane, diadamanthyldimethoxysilane, diadamanthyldiethoxysilane, diadamanthyldipropoxysilane, diadamanthyldiisopropoxysilane, diphenyldimethoxysilane, diphenyldiethoxysilane, methylphenyldimethoxysilane, methylphenyldiethoxysilane, diphenyidipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

In addition, illustrative example of the raw material of the component (A) includes a metallic compound represented by the following general formula (A-3),

wherein, $R^{8A}$ and $R^{9A}$ represent an organic group having 1 to 30 carbon atoms; a8, a9 and a10 represent an integer of 0 or more and a8+a9+2×a10 is the same number as the number determined by valency of L; and L is an element belonging to groups of III, IV, or V in a periodic table except for carbon and silicon.

L in the above general formula (A-3) is preferably any element of boron, aluminum, gallium, yttrium, germanium, titanium, zirconium, hafnium, bismuth, tin, phosphorus, vanadium, arsenic, antimony, niobium or tantalum. Illustrative example of the metallic compound can be shown as follows.

If L is boron, illustrative example of the metallic compound includes boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, and boron oxide.

If L is silicon, illustrative example of the metallic compound includes tetramethoxysilane, tetraethoxysilane, tetrapropoxysilane, tetraisopropoxysilane, tetrabutoxysilane, tetraphenoxysilane, and tetraacetoxysilane.

If L is aluminum, illustrative example of the metallic compound includes aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl acetoacetate, aluminum dibutoxyethyl acetoacetate, aluminum propoxy bisethyl acetoacetate, aluminum butoxy bisethyl acetoacetate, aluminum-2,4-pentanedionate, and aluminum-2,2,6,6-tetramethyl-3,5-heptanedionate.

If L is gallium, illustrative example of the metallic compound includes gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl acetoacetate, gallium dibutoxyethyl acetoacetate, gallium propoxy bisethyl acetoacetate, gallium butoxy bisethyl acetoacetate, gallium-2,4-pentanedionate, and gallium-2,2,6,6-tetramethyl-3,5-heptanedionate.

If L is yttrium, illustrative example of the metallic compound includes yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl acetoacetate, yttrium dibutoxyethyl acetoacetate, yttrium propoxy bisethyl acetoacetate, yttrium butoxy bisethyl acetoacetate, yttrium-2,4-pentanedionate, and yttrium-2,2,6,6-tetramethyl-3,5-heptanedionate.

If L is germanium, illustrative example of the metallic compound includes germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

If L is titanium, illustrative example of the metallic compound includes titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bisethyl acetoacetate, titanium dibutoxy bisethyl acetoacetate, titanium dipropoxy bis2,4-pentanedionate, and titanium dibutoxy bis2,4-pentanedionate.

If L is zirconium, illustrative example of the metallic compound includes methoxy zirconium, ethoxy zirconium, propoxy zirconium, butoxy zirconium, phenoxy zirconium, zirconium dibutoxidebis(2,4-pentanedionate), and zirconium dipropoxidebis(2,2,6,6-tetramethyl-3,5-heptanedionate).

If L is hafnium, illustrative example of the metallic compound includes hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bisethyl acetoacetate, hafnium dibutoxy bisethyl acetoacetate, hafnium dipropoxy bis2,4-pentanedionate, and hafnium dibutoxy bis2,4-pentanedionate.

If L is bismuth, illustrative example of the metallic compound includes methoxy bismuth, ethoxy bismuth, propoxy bismuth, butoxy bismuth, and phenoxy bismuth.

If L is tin, illustrative example of the metallic compound includes methoxy tin, ethoxy tin, propoxy tin, butoxy tin, phenoxy tin, methoxyethoxy tin, ethoxyethoxy tin, tin-2,4-pentanedionate, and tin-2,2,6,6-tetramethyl-3,5-heptanedionate.

If L is phosphorus, illustrative example of the metallic compound includes trimethyl phosphite, triethyl phosphite, tripropyl phosphite, trimethyl phosphate, triethyl phosphate, tripropyl phosphate, and diphosphorus pentoxide.

If L is vanadium, illustrative example of the metallic compound includes vanadium oxidebis(2,4-pentanedionate), vanadium-2,4-pentanedionate, vanadium tributoxideoxide, and vanadium tripropoxideoxide.

If L is arsenic, illustrative example of the metallic compound include methoxy arsenic, ethoxy arsenic, propoxy arsenic, butoxy arsenic, and phenoxy arsenic.

If L is antimony, illustrative example of the metallic compound includes methoxy antimony, ethoxy antimony, propoxy antimony, butoxy antimony, phenoxy antimony, antimony acetate, and antimony propionate.

If L is niobium, illustrative example of the metallic compound includes methoxy niobium, ethoxy niobium, propoxy niobium, butoxy niobium, and phenoxy niobium.

If L is tantalum, illustrative example of the metallic compound includes methoxy tantalum, ethoxy tantalum, propoxy tantalum, butoxy tantalum, and phenoxy tantalum.

A silicon-containing compound as a component (A) contained in the composition for forming a resist underlayer film of the present invention can be obtained by hydrolysis and/or condensation of one or more kinds of silicon compounds represented by the above general formula (A-1), preferably one or more kinds of silicon compounds represented by the above general formula (A-1) and one or more kinds of silicon compounds represented by the above general formula (A-2), more preferably one or more kinds of silicon compounds represented by the above general formula (A-1), one or more kinds of silicon compounds represented by the above general formula (A-2) and one or more kinds of metallic compounds represented by the above general formula (A-3) as a monomer.

A reaction raw material that composes a component (A) can be prepared by mixing the above monomers before or during the reaction. The component (A) can be produced by hydrolysis and/or condensation of the above monomers by using one or more kinds of compounds selected from inorganic acid, aliphatic sulfonic acid, and aromatic sulfonic acid as acid catalyst.

Illustrative example of the acid catalyst used includes formic acid, chloric acid, hydrobromic acid, sulfuric acid, nitric acid, perchloric acid, phosphoric acid, methanesulfonic acid, benzenesulfonic acid, and toluenesulfonic acid. The catalyst is used in the range of $1\times10^{-6}$ to 10 mole, preferably $1\times10^{-5}$ to 5 mole, and more preferably $1\times10^{-4}$ to 1 mole, per mole of a monomer.

The amount of water for obtaining a silicon-containing compound by hydrolysis and/or condensation of these monomers is preferably added in the range of 0.01 to 100 mole, more preferably 0.05 to 50 mole, and much more preferably 0.1 to 30 mole, per mole of a hydrolyzable substituent bonded to a monomer. If the amount is 100 mole or less, a reaction device becomes smaller and more economical.

In operation, a monomer is added to a catalyst aqueous solution to start hydrolyzation and condensation reaction. Organic solvent may be added to the catalyst aqueous solution, and a monomer may be diluted with the organic solvent, or both may be performed. The reaction temperature is preferably in the range of 0 to 100° C., and more preferably 5 to 80° C. The reaction temperature is maintained in the range of 5 to 80° C. when a monomer is dropped, and then the mixture is preferably aged in the range of 20 to 80° C.

Illustrative example of the organic solvent that can be added to a catalyst aqueous solution or can dilute a monomer includes methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycolmonomethyl ether, ethylene glycolmonomethyl ether, butanediol monoethylether, propylene glycol monoethylether, ethylene glycol monoethylether, propylene glycoldimethyl ether, diethylene glycoldimethyl ether, propylene glycolmonomethyl ether acetate, propylene glycol monoethylether acetate, ethyl pyruvate, butyl acetate, 3-methoxy methyl propionate, 3-ethoxy ethyl propionate, t-butyl acetate, t-butyl propionate, propylene glycol mono-t-butylether acetate, γ-butyrolactone and mixture thereof.

Illustrative example of these solvent includes water-soluble solvent, e.g., alcohol such as methanol, ethanol, 1-propanol, and 2-propanol; polyvalent alcohol such as ethylene glycol and propylene glycol; polyvalent alcohol condensate derivative such as butanediol monomethyl ether, propylene glycolmonomethyl ether, ethylene glycolmonomethyl ether, butanediol monoethylether, propylene glycol monoethylether, ethylene glycol monoethylether, butanediol monopropylether, propylene glycol monopropylether, and ethylene glycol monopropylether; acetone; acetonitrile; and tetrahydrofuran. Particularly preferable is solvent with a boiling point of 100° C. or less.

The amount of the organic solvent used is preferably in the range of 0 to 1,000 ml, and particularly 0 to 500 ml, per mole of a monomer. A smaller amount of the organic solvent used (1,000 ml or less) can make a reaction container smaller and more economical.

Then, the catalyst is subjected to neutralization reaction and alcohol produced by hydrolytic condensation reaction is removed under reduced pressure as required to obtain a reaction mixture aqueous solution. The amount of an alkaline substance to be used for neutralization is preferably 0.1 to 2 equivalent weight, relative to acid used in the catalyst. The alkaline substance may be optionally selected if it is alkaline in water.

Subsequently, it is preferable that a by-product such as alcohol produced by hydrolytic condensation reaction from the reaction mixture be removed under reduced pressure. The temperature for heating the reaction mixture is preferably in the range of 0 to 100° C., more preferably 10 to 90° C., and much more preferably 15 to 80° C., depending on the kind of alcohol generated by reaction with organic solvent added. The decompression degree is preferably an atmospheric pressure or less, more preferably 80 kPa or less under absolute pressure, and much more preferably 50 kPa or less under absolute pressure, depending on kinds of organic solvent to be removed and alcohol, ventilation, condensing apparatus and heating temperature. Despite a difficulty of exactly learning the amount of the alcohol to be removed, about 80% by mass or more of the alcohol generated is preferably removed.

Next, the acid catalyst used in hydrolytic condensation reaction may be removed from the reaction mixture. A method for removing acid catalyst is to mix water and a silicon-containing compound and extract the silicon-containing compound with organic solvent. Illustrative example of the organic solvent used includes the one that can dissolve a silicon-containing compound and achieve two-layer separation by mixing with water. Illustrative example thereof includes methanol, ethanol, 1-propanol, 2-propanol, 1-butanol, 2-butanol, 2-methyl-1-propanol, acetone, tetrahydrofuran, toluene, hexane, ethyl acetate, acetone, cyclohexanone, methyl amyl ketone, butanediol monomethyl ether, propylene glycolmonomethyl ether, ethylene glycolmonomethyl ether, butanediol monoethylether, propylene glycol monoethylether, ethylene glycol monoethylether, butanediol monopropylether, propylene glycol monopropylether, ethylene glycol monopropylether, propylene glycoldimethyl ether, diethylene glycoldimethyl ether, propylene glycolmonomethyl ether acetate, propylene glycol monoethylether acetate, ethyl pyruvate, butyl acetate, 3-methoxy methyl propionate, 3-ethoxy ethyl propionate, t-butyl acetate, t-butyl propionate, propylene glycol mono-t-butylether acetate, γ-butyrolactone, methylisobutyl ketone, cyclopentylmethylether, and mixture thereof.

Moreover, mixture of water-soluble organic solvent and slightly water soluble organic solvent can be used. Illustrative example thereof includes methanol+ethyl acetate mixture, ethanol+ethyl acetate mixture, 1-propanol+ethyl acetate mixture, 2-propanol+ethyl acetate mixture, butanediol monomethyl ether+ethyl acetate mixture, propylene glycolmonomethyl ether+ethyl acetate mixture, ethylene glycolmonomethyl ether+ethyl acetate mixture, butanediol monoethylether+ethyl acetate mixture, propylene glycol monoethylether+ethyl acetate mixture, ethylene glycol monoethylether+ethyl acetate mixture, butanediol monopropylether+ethyl acetate mixture, propylene glycol monopropylether+ethyl acetate mixture, ethylene glycol monopropylether+ethyl acetate mixture, methanol+methylisobutyl ketone mixture, ethanol+methylisobutyl ketone mixture, 1-propanol+methylisobutyl ketone mixture, 2-propanol+methylisobutyl ketone mixture, propylene glycolmonomethyl ether+methylisobutyl ketone mixture, ethylene glycolmonomethyl ether+methylisobutyl ketone mixture, propylene glycol monoethylether+methylisobutyl ketone mixture, ethylene glycol monoethylether+methylisobutyl ketone mixture, propylene glycol monopropylether+methylisobutyl ketone mixture, ethylene glycol monopropylether+methylisobutyl ketone mixture, methanol+cyclopentylmethylether mixture, ethanol+cyclopentylmethylether mixture, 1-propanol+cyclopentylmethylether mixture, 2-propanol+cyclopentylmethylether mixture, propylene glycolmonomethyl ether+cyclopentylmethylether mixture, ethylene glycolmonomethyl ether+cyclopentylmethylether mixture, propylene glycol monoethylether+cyclopentylmethylether mixture, ethylene glycol monoethylether+cyclopentylmethylether mixture, propylene glycol monopropylether+cyclopentylmethylether mixture, ethylene glycol monopropylether+cyclopentylmethylether mixture, methanol+propylene glycolmethyl ether acetate mixture, ethanol+propylene glycolmethyl ether acetate mixture, 1-propanol+propylene glycolmethyl ether acetate mixture, 2-propanol+propylene glycolmethyl ether acetate mixture, propylene glycolmonomethyl ether+propylene glycolmethyl ether acetate mixture, ethylene glycolmonomethyl ether+ propylene glycolmethyl ether acetate mixture, propylene glycol monoethylether+propylene glycolmethyl ether acetate mixture, ethylene glycol monoethylether+propylene glycolmethyl ether acetate mixture, propylene glycol monopropylether+propylene glycolmethyl ether acetate mixture, and ethylene glycol monopropylether propylene glycolmethyl ether acetate mixture, but is not restricted to combination of these mixtures.

The mixing ratio of the water-soluble organic solvent and the slightly water soluble organic solvent is determined accordingly. However, the water-soluble organic solvent is 0.1 to 1,000 parts by mass, preferably 1 to 500 parts by mass, and much more preferably 2 to 100 parts by mass, relative to a slightly water soluble organic solvent (100 parts by mass).

Subsequently, the mixture of the water-soluble organic solvent and the slightly water soluble organic solvent may be cleaned with neutral water. The neutral water may be deionized water or ultrapure water. The amount of the water is preferably 0.01 to 100 L, more preferably 0.05 to 50 L, and much more preferably 0.1 to 5 L, per liter of a silicon-containing compound solution. The method for cleaning the mixture is to charge both solvent into the same container, agitate them and then allow them to stand to separate a water layer. The number of cleaning may be once or more, but preferably once to 5 times because 10 or more cleaning is not effective.

Other methods for removing acid catalyst include a method by ion-exchange resin, and a method for removing acid catalyst after neutralization with an epoxy compound such as ethylene oxide and propylene oxide. These methods can be selected according to the kind of acid catalyst used in the reaction.

The water cleaning can allow part of a silicon-containing compound to move to and blend into a water layer, leading to fractionation effect. Therefore, the number and amount of water cleaning may be accordingly selected in view of catalyst-removing and fractionation effects.

As to both a silicon-containing compound having residual acid catalyst and a silicon-containing compound solution having no more acid catalyst, last solvent is added thereto and solvent is exchanged under reduced pressure to obtain a desired silicon-containing compound solution. The temperature for solvent exchange is preferably in the range of 0 to 100° C., more preferably 10 to 90° C., and much more preferably 15 to 80° C., depending on the kinds of reaction solvent to be removed and extracting solvent. The decompression degree is preferably an atmospheric pressure or less, more preferably 80 kPa or less under absolute pressure, and much more preferably 50 kPa or less under absolute pressure, depending on the kind of extracting solvent, ventilation, a condensing apparatus, and heating temperature.

Accordingly, change in solvent has possibility of labilization of the silicon-containing compound. In order to prevent this labilization that is caused due to chemical affinity of the last solvent and the silicon-containing compound, monovalent, divalent, or more polyvalent alcohol having cyclic ether as a substituent described in Japanese Patent Laid-Open Publication No. 2009-126940 (paragraphs (0181) to (0182)) may be added thereto as a stabilizer. The amount to be added is in the range of 0 to 25 parts by mass, preferably 0 to 15 parts by mass, and more preferably 0 to 5 parts by mass, relative to 100 parts by mass of a silicon-containing compound in a solution before solvent exchange, but 0.5 parts by mass or more, if alcohol is added, is most preferable. Monovalent, divalent, or more polyvalent alcohol having cyclic ether as a substituent may be added to a solution, as required, to perform solvent exchange.

If a silicon-containing compound is concentrated with more than a certain level of concentration, condensation reaction will further proceed, so that it cannot be redissoluted in organic solvent. Therefore, the concentration is preferably maintained at a proper level. If the concentration is too low to the contrary, the amount of solvent is not too large. Thus, a proper solution concentration is preferable in view of an economical production. The concentration is preferably in the range of 0.1 to 20% by mass.

Illustrative example of the last solvent added to a silicon-containing compound includes alcohol solvent, and particularly monoalkyl ether such as ethylene glycol, diethylene glycol, triethylene glycol, propylene glycol, dipropylene glycol, butanediol, and derivative thereof. Illustrative example thereof includes butanediol monomethyl ether, propylene glycolmonomethyl ether, ethylene glycolmonomethyl ether, butanediol monoethylether, propylene glycol monoethylether, ethylene glycol monoethylether, butanediol monopropylether, propylene glycol monopropylether, and ethylene glycol monopropylether.

With these solvents as a main component, non-alcohol solvent can be added as co-solvent. Illustrative example of the co-solvent includes acetone, tetrahydrofuran, toluene, hexane, ethyl acetate, cyclohexanone, methyl amyl ketone, propylene glycoldimethyl ether, diethylene glycoldimethyl ether, propylene glycolmonomethyl ether acetate, propylene glycol monoethylether acetate, ethyl pyruvate, butyl acetate, 3-methoxy methyl propionate, 3-ethoxy ethyl propionate, t-butyl acetate, t-butyl propionate, propylene glycol mono-t-butylether acetate, γ-butyrolactone, methylisobutyl ketone, and cyclopentylmethylether.

In another operation by using acid catalyst, water or water-containing organic solvent is added to a monomer or an organic solution of a monomer to start hydrolysis reaction. The catalyst may be added to a monomer or an organic solution of a monomer or added to water or water-containing organic solvent. The reaction temperature is preferably in the range of 0 to 100° C., and more preferably 10 to 80° C. A method for heating a mixture at 10 to 50° C. when water is dropped and then heating the mixture at 20 to 80° C. to age the mixture is preferable.

Illustrative example of the organic solvent includes water-soluble solvent, e.g. polyvalent alcohol condensate derivative such as methanol, ethanol, 1-propanol, 2-propanol, 1-butanol, 2-butanol, 2-methyl-1-propanol, acetone, tetrahydrofuran, acetonitrile, butanediol monomethyl ether, propylene glycolmonomethyl ether, ethylene glycolmonomethyl ether, butanediol monoethylether, propylene glycol monoethylether, ethylene glycol monoethylether, butanediol monopropylether, propylene glycol monopropylether, ethylene glycol monopropylether, propylene glycoldimethyl ether, diethylene glycoldimethyl ether, propylene glycolmonomethyl ether acetate, propylene glycol monoethylether acetate, and propylene glycol monopropylether, and a mixture thereof.

The amount of the organic solvent used may be the same as before. A reaction mixture obtained is post-treated like the method to obtain a silicon-containing compound.

The silicon-containing compound can be obtained by hydrolysis and/or condensation of monomers in the presence of base catalyst. Illustrative example of the base catalyst used includes methylamine, ethylamine, propylamine, butylamine, ethylenediamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclo cyclononene, diazabicycloundecene, hexamethylene tetraamine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The amount of the catalyst used is preferably in the range of $1\times10^{-6}$ mole to 10 mole, more preferably $1\times10^{-5}$ mole to 5 mole, and much more preferably $1\times10^{-4}$ mole to 1 mole, per mole of a silicon monomer.

The amount of water for obtaining a silicon-containing compound by hydrolysis and/or condensation of the above monomers is preferably in the range of 0.1 to 50 mole to be added, per mole of a hydrolyzable substituent bonded to the monomer. If the amount is 50 mole or less, a reaction device becomes smaller and more economical.

In operation, a monomer is added to catalyst solution to start hydrolytic condensation reaction. Organic solvent may be added to catalyst solution, a monomer may be diluted with organic solvent, or both may be performed. The reaction temperature is preferably in the range of 0 to 100° C., and more preferably 5 to 80° C. A method for maintaining the temperature at 5 to 80° C. when a monomer is dropped and then aging the mixture at 20 to 80° C. is preferable.

The organic solvent used that can be added to base catalyst solution or can dilute a monomer is preferably an illustrative example of the organic solvent that can be added to acid catalyst solution. The amount of the organic solvent used is preferably in the range of 0 to 1,000 ml, per mole of a monomer, due to economical reaction.

As required, catalyst is subjected to neutralization reaction afterward and alcohol produced by hydrolytic condensation reaction is removed under reduced pressure to obtain a reaction mixture aqueous solution. The amount of acid material used for neutralization is preferably in the range of 0.1 to 2 equivalent weight, relative to basic substance used in the catalyst. The acid material may be optionally selected if it is acid in water.

Subsequently, it is preferable that a by-product such as alcohol produced by hydrolytic condensation reaction from the reaction mixture be removed under reduced pressure. The temperature for heating the reaction mixture is preferably in the range of 0 to 100° C., more preferably 10 to 90° C., and much more preferably 15 to 80° C., depending on the kind of alcohol generated by reaction with organic solvent added. The decompression degree is preferably an atmospheric pressure or less, more preferably 80 kPa or less under absolute pressure, and much more preferably 50 kPa or less under absolute pressure, depending on kinds of organic solvent to be removed and alcohol, ventilation, condensing apparatus and heating temperature. Despite a difficulty of exactly learning the amount of the alcohol to be removed, about 80% by mass or more of the alcohol generated is preferably removed.

Next, to remove the catalyst used in a hydrolytic condensation reaction, a silicon-containing compound is extracted with organic solvent. The organic solvent used can preferably dissolve a silicon-containing compound and achieve two-layer separation by mixing with water. Illustrative example thereof includes methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycolmonomethyl ether, ethylene glycolmonomethyl ether, propylene glycol monoethylether, ethylene glycol monoethylether, propylene glycol monopropylether, ethylene glycol monopropylether, propylene glycoldimethyl ether, diethylene glycoldimethyl ether, propylene glycolmonomethyl ether acetate, propylene glycol monoethylether acetate, ethyl pyruvate, butyl acetate, 3-methoxy methyl propionate, 3-ethoxy ethyl propionate, t-butyl acetate, t-butyl propionate, propylene glycol mono-t-butylether acetate, γ-butyrolactone, methylisobutyl ketone, cyclopentylmethylether, and a mixture thereof.

Next, to remove the base catalyst used in a hydrolytic condensation reaction, a silicon-containing compound is extracted with organic solvent. The organic solvent used can preferably dissolve a silicon-containing compound and achieve two-layer separation by mixing with water.

Moreover, mixture of water-soluble organic solvent and slightly water soluble organic solvent can be used.

Illustrative example of the organic solvent used for removing base catalyst includes the above-mentioned organic solvent for removing the acid catalyst, and mixture of water-soluble organic solvent and slightly water soluble organic solvent.

The mixing ratio of the water-soluble organic solvent and the slightly water soluble organic solvent is determined accordingly. However, the water-soluble organic solvent is preferably 0.1 to 1,000 parts by mass, more preferably 1 to 500 parts by mass, and much more preferably 2 to 100 parts by mass, relative to slightly water soluble organic solvent (100 parts by mass).

Subsequently, the mixture of the water-soluble organic solvent and the slightly water soluble organic solvent may be cleaned with neutral water. The neutral water may be deionized water or ultrapure water. The amount of the water is preferably 0.01 to 100 L, more preferably 0.05 to 50 L, and much more preferably 0.1 to 5 L, per liter of a silicon-containing compound solution. The method for cleaning the mixture is to charge both solvent into the same container, agitate them and then allow them to stand to separate a water layer. The number of cleaning may be once or more, but preferably once to 5 times because 10 or more cleaning is not effective.

Last solvent is added to a cleaned silicon-containing compound solution and solvent is exchanged under reduced pressure to obtain a desired silicon-containing compound solution. The temperature for solvent exchange is preferably in the range of 0 to 100° C., more preferably 10 to 90° C., and much more preferably 15 to 80° C., depending on the kinds of reaction solvent to be removed and extracting solvent. The decompression degree is preferably an atmospheric pressure or less, more preferably 80 kPa or less under absolute pressure, and much more preferably 50 kPa or less under absolute pressure, depending on the kind of extracting solvent, ventilation, a condensing apparatus, and heating temperature.

Illustrative example of the last solvent added to a silicon-containing compound includes alcohol solvent, and particularly alkyl ether such as ethylene glycol, diethylene glycol, and triethylene glycol, propylene glycol and dipropylene glycol. Illustrative example thereof includes propylene glycolmonomethyl ether, ethylene glycolmonomethyl ether, propylene glycol monoethylether, ethylene glycol monoethylether, propylene glycol monopropylether, and ethylene glycol monopropylether.

In another operation by using base catalyst, water or water-containing organic solvent is added to a monomer or an organic solution of a monomer to start hydrolysis reaction.

The catalyst may be added to a monomer or an organic solution of a monomer or added to water or water-containing organic solvent. The reaction temperature is preferably in the range of 0 to 100° C., and more preferably 10 to 80° C. A method for heating a mixture at 10 to 50° C. when water is dropped and then heating the mixture at 20 to 80° C. to age the mixture is preferable.

The organic solvent is preferably water-soluble solvent and illustrative example thereof includes polyvalent alcohol condensate derivative such as methanol, ethanol, 1-propanol, 2-propanol, 1-butanol, 2-butanol, 2-methyl-1-propanol, acetone, tetrahydrofuran, acetonitrile, propylene glycolmonomethyl ether, ethylene glycolmonomethyl ether, propylene glycol monoethylether, ethylene glycol monoethylether, propylene glycol monopropylether, ethylene glycol monopropylether, propylene glycoldimethyl ether, diethylene glycoldimethyl ether, propylene glycolmonomethyl ether acetate, propylene glycol monoethylether acetate, and propylene glycol monopropylether, and mixture thereof.

The molecular weight of the silicon-containing compound obtained can be adjusted not only by selecting a monomer, but also controlling reaction conditions during polymerization. However, if the average molecular weight is 100,000 or less, the silicon-containing compound could preferably show no foreign object or coating spot. The average molecular weight is more preferably 200 to 50,000, and much more preferably 300 to 30,000.

The above average molecular weight is obtained as data, in terms of polystyrene as a reference material, by means of gel-permeation chromatography (GPC) by using RI as a detector and tetrahydrofuran as an eluant.

The composition for forming a resist underlayer film containing component (A) can form a resist underlayer film having favorable pattern adhesiveness relative to a fine pattern even in a complicated patterning process.

Component (B)

Illustrative example of the raw material of a component (B) that can be contained in the composition for forming a resist underlayer film of the present invention can include metallic compound represented by the following general formula (B-1),

$$M(OR^{OB})_{b0}(OR^{1B})_{b1}(O)_{b2} \tag{B-1}$$

wherein, $R^{OB}$ and $R^{1B}$ represent an organic group having 1 to 10 carbon atoms; b0, b1 and b2 represent an integer of 0 or more and b0+b1+2×b2 is the same number as the number determined by valency of M, and M is an element belonging to groups of III, IV, or V in a periodic table except for carbon.

M in the general formula (B-1) is preferably any element of silicon, aluminum, germanium, titanium, zirconium, and hafnium. The metallic compound can be illustrated as follows.

If M is silicon, illustrative example of the metallic compound includes tetramethoxysilane, tetraethoxysilane, tetrapropoxysilane, tetraisopropoxysilane, tetrabutoxysilane, tetraphenoxysilane, and tetraacetoxysilane.

If M is aluminum, illustrative example of the metallic compound includes aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl acetoacetate, aluminum dibutoxyethyl acetoacetate, aluminum propoxy bisethyl acetoacetate, aluminum butoxy bisethyl acetoacetate, aluminum-2,4-pentanedionate, and aluminum-2,2,6,6-tetramethyl-3,5-heptanedionate.

If M is germanium, illustrative example of the metallic compound includes germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

If M is titanium, illustrative example of the metallic compound includes titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bisethyl acetoacetate, titanium dibutoxy bisethyl acetoacetate, titanium dipropoxy bis2,4-pentanedionate, and titanium dibutoxy bis2,4-pentanedionate.

If M is zirconium, illustrative example of the metallic compound includes methoxy zirconium, ethoxy zirconium, propoxy zirconium, butoxy zirconium, phenoxy zirconium, zirconium dibutoxidebis(2,4-pentanedionate), and zirconium dipropoxidebis(2,2,6,6-tetramethyl-3,5-heptanedionate).

If M is hafnium, illustrative example of the metallic compound includes hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bisethyl acetoacetate, hafnium dibutoxy bisethyl acetoacetate, hafnium dipropoxy bis2,4-pentanedionate, and hafnium dibutoxy bis2,4-pentanedionate.

Illustrative example of the raw material of component (B) can include a silicon compound represented by the following general formula (3-2),

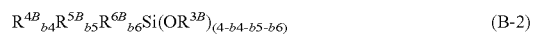
$$R^{4B}_{b4}R^{5B}_{b5}R^{6B}_{b6}Si(OR^{3B})_{(4-b4-b5-b6)} \tag{B-2}$$

wherein, $R^{3B}$ represents a hydrocarbon group having 1 to 6 carbon atoms; each of $R^{4B}$, $R^{5B}$ and $R^{6B}$ represents a hydrogen atom or a monovalent organic group having 1 to 30 carbon atoms; and b4, b5 and b6 represent 0 or 1 and satisfy 1≤b4+b5+b6≤3.

Illustrative example of the silicon compound can include a silicon compound represented by the above general formula (A-2).

The metal-containing compound as the component (B) that can be contained in the composition for forming a resist underlayer film of the present invention can be obtained by hydrolysis and/or condensation of one or more kinds of metallic compounds represented by the above general formula (B-1), preferably one or more kinds of metallic compounds represented by the above general formula (B-1) and one or more kinds of silicon compounds represented by the above general formula (B-2) as a monomer.

A reaction raw material that forms a component (B) can be prepared by mixing the above monomers before or during the reaction. Illustrative example of a method for producing the component (B) can be the same as the method for producing the above-mentioned component (A).

The composition for forming a resist underlayer film further containing the component (B) can provide a resist underlayer film having a higher etching selectivity relative to an organic film and a silicon-containing film.

When the above component (B) is contained in the composition for forming resist underlayer film of the present invention, the mass ratio of the above component (A) and the above component (B) preferably satisfies component (B) component (A). With the mass ratio, it is preferable that etching selectivity relative to an organic film and a silicon-containing film be sufficiently obtained.

Other Components

A thermal crosslinking accelerator may be further added to the composition for forming a resist underlayer film of the present invention. As the thermal crosslinking accelerator, a composition described in Japanese Patent Laid-Open Publication No. 2007-302873 can be used.

The above thermal crosslinking accelerator can be used alone or in combination with one or more kinds thereof. The amount of the thermal crosslinking accelerator to be added is preferably in the range of 0.01 to 50 parts by mass, more preferably 0.1 to 40 parts by mass, relative to 100 parts by mass of a polysiloxane as a base polymer (silicon-containing compound of component (A) obtained in the above method).

To further improve the stability of the silicon-containing composition for forming a resist underlayer film of the present invention, monovalent, divalent, or polyvalent organic acid having 1 to 30 carbon atoms is preferably added. Illustrative example of the acid to be added includes formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methyl malonate, ethyl malonate, propyl malonate, butyl malonate, dimethyl malonate, diethyl malonate, succinic acid, methyl succinate, glutaric acid, adipic acid, itaconic acid, maleic acid, fumaric acid, citraconic acid, and citric acid, and particularly preferable are oxalic acid, maleic acid, formic acid, acetic acid, propionic acid, and citric acid. To maintain the stability, two or more kinds of acids may be mixed. The organic acid is preferably added, so that pH of the composition having the organic acid preferably satisfies $0 \leq pH \leq 7$, more preferably $0.3 \leq pH \leq 6.5$, much more preferably $0.5 \leq pH \leq 6$. The amount of the acid to be added is in the range of 0.001 to 25 parts by mass, preferably 0.01 to 15 parts by mass, and more preferably 0.1 to 5 parts by mass, relative to 100 parts by mass of silicon contained in the composition.

Water may be added to the composition for forming a resist underlayer film of the present invention. Water addition hydrates a silicon-containing compound in the composition to improve lithography performance. The water content in the solvent component of the composition is preferably exceeds 0% by mass and under 50% by mass, more preferably 0.3 to 30% by mass, and much more preferably 0.5 to 20% by mass. Each component, if its water content is under 50% by mass, can improve the uniformity of the coating film, preferably resulting in no eye hole. On the other hand, the content preferably exceeds 0% by mass, because lithography performance can be improved.

The amount of all solvents containing water used is preferably 100 to 100,000 parts by mass, particularly 200 to 50,000 parts by mass, relative to 100 parts by mass of a base polymer (a silicon-containing compound of component (A) obtained in the above method).

A photoacid generator may further be added to the composition for forming a resist underlayer film of the present invention. Illustrative example of the photoacid generator used in the present invention includes a composition described in Japanese Patent Laid-Open Publication No. 2009-126940 (paragraphs (0160) to (0179)).

Moreover, in the present invention, a stabilizer may be further added to the composition for forming resist underlayer film. By adding the stabilizer, stability of a composition can be improved. Specifically, monovalent, divalent, or polyvalent alcohol having cyclic ether described in Japanese Patent Laid-Open Publication No. 2009-126940 paragraphs [0126] to [0127] can be added as a substituent, and particularly an ether compound can be added as a material.

A surfactant can be blended into the composition for forming a resist underlayer film of the present invention as required, specifically a composition described in Japanese Patent Laid-Open Publication No. 2009-126940 (paragraph (0129)).

The composition for forming a resist underlayer film can provide a resist underlayer film having a higher etching selectivity relative to an organic film and a silicon-containing film, in addition to favorable pattern adhesiveness relative to fine pattern in a 2-layer structure having the component (A) and the component (B).

Patterning Process

The present invention provides one embodiment of a patterning process by using a composition for forming a resist underlayer film prepared above comprising: forming an organic underlayer film on a body to be processed by using an application-type organic underlayer film composition; forming a resist underlayer film on the organic underlayer film by using the composition for forming a resist underlayer film; forming a resist upper layer film on the resist underlayer film by using a composition for forming a resist upper layer film; forming a pattern on the resist upper layer film; transferring the pattern on the resist underlayer film by using the resist upper layer film having the formed pattern as a mask; transferring a pattern on the organic underlayer film by using the resist underlayer film having the transferred pattern as a mask; and transferring a pattern on the body to be processed by using the organic underlayer film having the transferred pattern as a mask.

The present invention provides another embodiment of a patterning process comprising: forming an organic hard mask with carbon as a main component on a body to be processed by a CVD method; forming a resist underlayer film on the organic hard mask by using the composition for forming a resist underlayer film; forming a resist upper layer film on the resist underlayer film by using a composition for forming a resist upper layer film; forming a pattern on the resist upper layer film; transferring a pattern on the resist underlayer film by using the resist upper layer film having the formed pattern as a mask; transferring a pattern on the organic hard mask by using the resist underlayer film having the transferred pattern as a mask; and transferring a pattern on the body to be processed by using the organic hard mask having the transferred pattern as a mask.

Herein, the body to be processed is preferably a semiconductor device substrate coated, as a layer to be processed, with any of metal film, metal carbide film, metal oxide film, metal nitride film, metal oxycarbide film, and metal oxynitride film.

The semiconductor device substrate is normally a silicon substrate, but is not particularly restricted thereto, and Si, amorphous silicon ($\alpha$-Si), p-Si, $SiO_2$, SiN, SiON, W, Tin, and Ai may be used as a composition that is different from a layer to be processed.

A metal that constitutes the body to be processed can be any of silicon, titanium, tungsten, hafnium, zirconium, chromium, germanium, copper, aluminum, indium, gallium, arsenic, palladium, iron, tantalum iridium, molybdenum or an alloy of these metals. Illustrative example of the layer to be processed containing the metal includes Si, $SiO_2$, SiN, SiON, SiOC, p-Si, $\alpha$-Si, TiN, WSi, BPSG, SOG, Cr, CrO, CrON, MoSi, W, W—Si, Al, Cu, and Al—Si, various low-dielectric films, and its etching stopper films, and the metal can normally be formed with a thickness of 50 to 10,000 nm, particularly 100 to 5,000 nm.

The patterning process of the present invention can form an organic underlayer film or an organic hard mask on a body to be processed. The organic underlayer film can be formed from an application-type organic underlayer film composition by using spin-coating method, and the organic hard mask can be formed from an organic hard mask composition with carbon as a main component by using a CVD method. The organic underlayer film and the organic hard mask are not particularly restricted, but they preferably express a sufficient antireflection film function when a resist upper layer film is patterned by exposure. By forming the organic underlayer film or the organic hard mask, a pattern formed on the resist upper layer film can be transferred on a body to be processed without size conversion difference.

The resist underlayer film used in the patterning process of the present invention can be produced on a body to be processed from the above composition for forming a resist underlayer film by using spin-coating method. After spin coating, it is preferable that a solvent be evaporated and the resist underlayer film be baked to promote crosslinking reaction in order to prevent mixing with a later-described resist upper layer film. Preferably, the baking temperature is in the range of 50 to 500° C. and the baking duration is in the range of 10 to 300 seconds. More preferably, the temperature is 400° C. or less to control thermal damage to devices, depending on the structure of a device produced.

In the patterning process of the present invention, a resist upper layer film is preferably exposed by any of the method of photolithography with a wavelength of 300 nm or less or EUV beam, the method of a direct drawing with electron beam, the directed self assembly method and the nano-imprinting lithography method. By using one of these methods, a fine pattern can be formed on a resist upper layer film.

A composition for forming a resist upper layer film can be selected according to a method for forming a pattern on the above resist upper layer film. For instance, in case of photolithography by using beam with a wavelength of 300 nm or less or EUV beam, a photoresist film composition of a chemically amplified type can be used as a composition for forming a resist upper layer film. Illustrative example of the photoresist film composition can include positive patterning by dissolving an exposed area by using alkaline developer after forming a photoresist film and performing exposure and negative patterning by dissolving a non-exposed area by using a developer composed of organic solvent.

When ArF excimer laser beam is used as beam with a wavelength of 300 nm or less to perform photolithography, any normal resist composition for ArF excimer laser beam can be used as a composition for forming a resist upper layer film. In fact, many known candidate resist compositions for ARF excimer laser beam are roughly classified into poly (meta) acrylic, cyclo olefin maleic anhydride (COMA), COMA-(meta) acrylic hybrid, ring opening methathesis polymerization (ROMP), and polynorbornene resins. Among these resins, resist compositions by using a poly(meta) acrylic resin have excellent resolution compared with other types of resins, due to a favorable etching resistance with an alicyclic skeleton introduced into side chain.

The patterning process of the present invention has an excellent pattern adhesiveness of a resist underlayer film, thereby generating no pattern collapse even by fine patterning in a resist upper layer film. Since its etching selectivity relative to an organic film and a silicon-containing film is excellent, size conversion difference is controlled by optimizing a combination of an organic underlayer film and an organic hard mask to transfer a pattern.

In the present invention, the patterning process is not restricted to the above illustrated examples, and a method containing a plurality of patterning steps such as double patterning can be used to achieve finer patterning.

EXAMPLE

The present invention will be specifically described with reference to Synthesis Examples, Examples and Comparative Examples, but it is not restricted thereto. "%" in the following Examples represents "% by mass" and the molecular weight is measured by GPC.

Synthesis of Component (A)

Synthesis Example A-I

A mixture of [Monomer 101] (47.7 g), [Monomer 102] (15.2 g) and [Monomer 103] (12.9 g) was added to a mixture of methanol (200 g), 35% hydrochloric acid (0.1 g) and deionized water (60 g) and the temperature was maintained at 40° C. for 12 hours to be subjected to hydrolytic condensation. After completion of the reaction, propylene glycol methyl ether acetate (PGMEA) (500 g) was added thereto to remove by-product alcohol and excessive water under reduced pressure and to obtain a PGMEA solution of a silicon-containing compound A-I (330 g) (compound concentration: 11.7%). The molecular weight (Mw) of the compound measured in terms of polystyrene was 2,600.

Synthesis Example A-II

The steps were the same as Synthesis Example A-I, except for use of [Monomer 104] (11.8 g), instead of [Monomer 103] (12.9 g) of Synthesis Example A-I to obtain a PGMEA solution of a silicon-containing compound A-II (310 g) (compound concentration: 12.3%). The molecular weight (Mw) of the compound measured in terms of polystyrene was 3,400.

Synthesis Example A-III

The steps were the same as Synthesis Example A-I, except for use of [Monomer 105] (23.9 g), instead of [Monomer 103] (12.9 g) of Synthesis Example A-I to obtain a PGMEA solution of a silicon-containing compound A-III (420 g) (compound concentration: 11.9%). The molecular weight (Mw) of the compound measured in terms of polystyrene was 3,100.

Synthesis Example A-IV

The steps were the same as Synthesis Example A-I, except for use of [Monomer 106] (27.7 g), instead of [Monomer 103] (12.9 g) of Synthesis Example A-I to obtain a PGMEA solution of a silicon-containing compound A-IV (470 g) (compound concentration: 11.5%). The molecular weight (Mw) of the compound measured in terms of polystyrene was 2,800.

Synthesis Example A-V

The steps were the same as Synthesis Example A-I, except for use of [Monomer 107] (24.7 g), instead of [Monomer 103] (12.9 g) of Synthesis Example A-I to obtain a PGMEA solution of a silicon-containing compound A-V (460 g) (compound concentration: 11.0%). The molecular weight (Mw) of the compound measured in terms of polystyrene was 3,200.

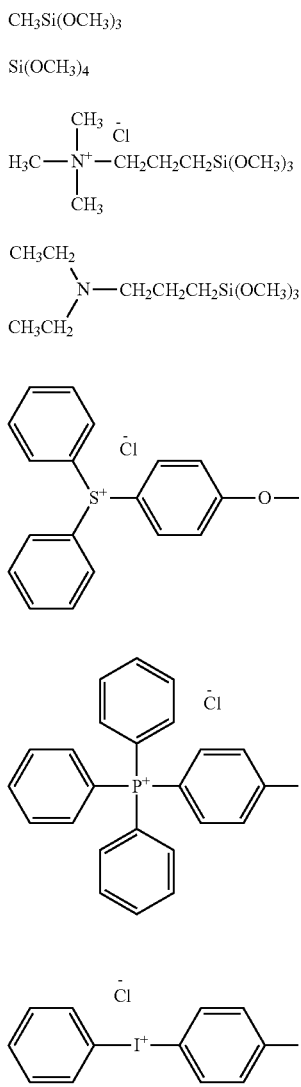

[Monomer 101] CH₃Si(OCH₃)₃

[Monomer 102] Si(OCH₃)₄

[Monomer 103]

[Monomer 104]

[Monomer 105]

[Monomer 106]

[Monomer 107]

Synthesis of Component (B)

Synthesis Example B-I

A mixture of purified water (2.7 g) and isopropyl alcohol (50 g) was dropped to a mixture of titanium tetraisopropoxide (28.4 g), isopropyl alcohol (50 g) and 2-(butylamino)ethanol (11.8 g). After completion of dropping, the mixture was agitated for 2 hours, subjected to hydrolytic condensation and heated to reflux for 2 hours. PGMEA (100 g) was added thereto and was concentrated under reduced pressure to obtain a PGMEA solution of a titanium-containing condensate (B-I) (130 g). The solid content concentration of the titanium-containing condensate was 13.5%.

Synthesis Example B-II

A mixture of purified water (2.7 g) and isopropyl alcohol (50 g) was dropped to a mixture of zirconium tetraisopropoxide (32.7 g), isopropyl alcohol (50 g) and acetylacetone (50 g). After completion of dropping, the mixture was agitated for 2 hours, subjected to hydrolytic condensation and heated to reflux for 2 hours. PGMEA (200 g) was added thereto and was concentrated under reduced pressure to obtain a PGMEA solution of a zirconium-containing condensate (B-II) (250 g). The solid content concentration of the zirconium-containing condensate was 10.5%.

Synthesis Example B-III

A mixture of purified water (1.8 g) and isopropyl alcohol (40 g) was dropped to a mixture of aluminum tributoxide (24.6 g), isopropyl alcohol (60 g) and diethyl malonate (16 g). After completion of dropping, the mixture was agitated for 2 hours, subjected to hydrolytic condensation and heated to reflux for 2 hours. PGMEA (200 g) was added thereto and was concentrated under reduced pressure to obtain a PGMEA solution of an aluminum-containing condensate (B-III) (150 g). The solid content concentration of the aluminum-containing condensate was 9.9%.

Synthesis Example B-IV

A mixture of purified water (2.0 g) and isopropyl alcohol (50 g) was dropped to a mixture of aluminum tributoxide (12.3 g), titanium tetraisopropoxide (14.2 g) and isopropyl alcohol (50 g). After completion of dropping, acetylacetone (20 g) was added to the mixture, agitated for 2 hours, subjected to hydrolytic condensation and heated to reflux for 2 hours. PGMEA (100 g) was added thereto and was concentrated under reduced pressure to obtain a PGMEA solution of an aluminum-titanium-containing condensate (B-IV) (150 g). The solid content concentration of the aluminum-titanium-containing condensate was 11.5%.

Synthesis Example B-V

A mixture of purified water (2.7 g) and isopropyl alcohol (50 g) was dropped to a mixture of titanium tetraisopropoxide (14.2 g), zirconium tetraisopropoxide (16.3 g) and isopropyl alcohol (50 g). After completion of dropping, acetylacetone (20 g) was added to the mixture, agitated for 2 hours, subjected to hydrolytic condensation and heated to reflux for 2 hours. PGMEA (150 g) was added thereto and was concentrated under reduced pressure to obtain a PGMEA solution of a titanium-zirconium-containing condensate (B-V) (200 g). The solid content concentration of the titanium-zirconium-containing condensate was 10.9%.

Synthesis Example B-VI

A mixture of purified water (2.0 g) and isopropyl alcohol (50 g) was dropped to a mixture of aluminum tributoxide (12.3 g), zirconium tetraisopropoxide (16.3 g) and isopropyl alcohol (50 g). After completion of dropping, acetylacetone (20 g) was added to the mixture, agitated for 2 hours, subjected to hydrolytic condensation and heated to reflux for 2 hours. PGMEA (150 g) was added thereto and was concentrated under reduced pressure to obtain a PGMEA solution of an aluminum-zirconium-containing condensate (B-VI) (200 g). The solid content concentration of the aluminum-zirconium-containing condensate was 11.1%.

Synthesis Example B-VII

A mixture of purified water (2.2 g) and isopropyl alcohol (50 g) was dropped to a mixture of zirconium tetraisopropoxide (16.3 g), hafnium2,4-pentanedionato (28.7 g) and isopropyl alcohol (70 g). After completion of dropping, acetylacetone (50 g) was added to the mixture, agitated for 2 hours, subjected to hydrolytic condensation and heated to reflux for 2 hours. PGMEA (200 g) was added thereto and was concentrated under reduced pressure to obtain a PGMEA solution of a zirconium-hafnium-containing condensate (B-VII) (250 g). The solid content concentration of the zirconium-hafnium-containing condensate was 11.2%.

Example, Comparative Example

The silicon-containing compounds (A-I) to (A-V) as a component (A) and the metal oxide-containing compounds (B-I) to (B-VII) as a component (B) obtained in the above Synthesis Examples, and solvents were mixed with the ratios shown in Tables 1 and 2. By filtering the mixture with a 0.1 µM fluorine resin filter, each composition for forming a resist underlayer film was prepared to be defined as Sol. 1 to 36.

TABLE 1

| No. | Component (A) Silicon-containing compound (parts by mass) | Component (B) Metal-containing compound (parts by mass) | Solvent (parts by mass) |
| --- | --- | --- | --- |
| Sol. 1 | A-I (0.1) | B-I (2.0) | PGMEA (100) |
| Sol. 2 | A-I (0.1) | B-II (2.0) | PGMEA (100) |
| Sol. 3 | A-I (0.1) | B-III (2.0) | PGMEA (100) |
| Sol. 4 | A-I (0.1) | B-IV (2.0) | PGMEA (100) |
| Sol. 5 | A-I (0.1) | B-V (2.0) | PGMEA (100) |
| Sol. 6 | A-I (0.1) | B-VI (2.0) | PGMEA (100) |
| Sol. 7 | A-I (0.1) | B-VII (2.0) | PGMEA (100) |
| Sol. 8 | A-II (0.1) | B-I (2.0) | PGMEA (100) |
| Sol. 9 | A-II (0.1) | B-II (2.0) | PGMEA (100) |
| Sol. 10 | A-II (0.1) | B-III (2.0) | PGMEA (100) |
| Sol. 11 | A-II (0.1) | B-IV (2.0) | PGMEA (100) |
| Sol. 12 | A-II (0.1) | B-V (2.0) | PGMEA (100) |
| Sol. 13 | A-II (0.1) | B-VI (2.0) | PGMEA (100) |
| Sol. 14 | A-II (0.1) | B-VII (2.0) | PGMEA (100) |
| Sol. 15 | A-III (0.1) | B-I (2.0) | PGMEA (100) |
| Sol. 16 | A-III (0.1) | B-II (2.0) | PGMEA (100) |
| Sol. 17 | A-III (0.1) | B-III (2.0) | PGMEA (100) |
| Sol. 18 | A-III (0.1) | B-IV (2.0) | PGMEA (100) |

TABLE 2

| No. | Component (A) Silicon-containing compound (parts by mass) | Component (B) Metal-containing compound (parts by mass) | Solvent (parts by mass) |
| --- | --- | --- | --- |
| Sol. 19 | A-III (0.1) | B-V (2.0) | PGMEA (100) |
| Sol. 20 | A-III (0.1) | B-VI (2.0) | PGMEA (100) |
| Sol. 21 | A-III (0.1) | B-VII (2.0) | PGMEA (100) |
| Sol. 22 | A-IV (0.1) | B-I (2.0) | PGMEA (100) |
| Sol. 23 | A-IV (0.1) | B-II (2.0) | PGMEA (100) |
| Sol. 24 | A-IV (0.1) | B-III (2.0) | PGMEA (100) |
| Sol. 25 | A-IV (0.1) | B-IV (2.0) | PGMEA (100) |
| Sol. 26 | A-IV (0.1) | B-V (2.0) | PGMEA (100) |
| Sol. 27 | A-IV (0.1) | B-VI (2.0) | PGMEA (100) |
| Sol. 28 | A-IV (0.1) | B-VII (2.0) | PGMEA (100) |
| Sol. 29 | A-V (0.1) | B-I (2.0) | PGMEA (100) |
| Sol. 30 | A-V (0.1) | B-II (2.0) | PGMEA (100) |
| Sol. 31 | A-V (0.1) | B-III (2.0) | PGMEA (100) |
| Sol. 32 | A-V (0.1) | B-IV (2.0) | PGMEA (100) |
| Sol. 33 | A-V (0.1) | B-V (2.0) | PGMEA (100) |
| Sol. 34 | A-V (0.1) | B-VI (2.0) | PGMEA (100) |
| Sol. 35 | A-V (0.1) | B-VII (2.0) | PGMEA (100) |
| Sol. 36 | — | B-I (2.1) | PGMEA (100) |

Etching Test

The above compositions for forming a resist underlayer film Sol. 1 to 36 were applied on a silicon wafer and heated at 240° C. for 60 seconds to produce a 50 nm resist underlayer film (Films 1 to 36). The resist underlayer films were each subjected to dry etching on the following conditions (1) and (2) to measure the etching rate. As a comparable object, a 200 nm spin-on carbon film ODL-50 (Product from Shin-Etsu Chemical Co., Ltd.: carbon content; 80% by mass) and a 50 nm spin-on silicon-containing film SHB-A940 (Product from Shin-Etsu Chemical Co., Ltd.: silicon content; 43% by mass) were formed to be subjected to dry etching on the same conditions, and the etching rate was measured. Table 3 shows the results.

(1) Etching condition by using $CHF_3/CF_4$-based gas Device: dry etching apparatus Telius SP (Product from Tokyo Electron Limited.)

| Etching condition (1): | |
| --- | --- |
| Chamber pressure | 20 Pa |
| Upper/Lower RF power | 500 W/500 W |
| $CHF_3$ gas flow rate | 50 ml/min |
| $CF_4$ gas flow rate | 150 ml/min |
| AR gas flow rate | 300 ml/min |
| Processing time | 20 sec |

(2) Etching condition by using $O_2/N_2$-based gas Device: dry etching apparatus Telius SP (Product from Tokyo Electron Limited.)

| Etching condition (2): | |
| --- | --- |
| Chamber pressure | 1.5 Pa |
| Upper/Lower RF power | 1000 W/300 W |
| $CO_2$ gas flow rate | 300 ml/min |
| $N_2$ gas flow rate | 100 ml/min |
| Processing time | 40 sec |

TABLE 3

| No. | Condition (1) (nm/min) | Condition (2) (nm/min) |
| --- | --- | --- |
| Film 1 | 37 | 2 |
| Film 2 | 37 | 2 |
| Film 3 | 37 | 2 |
| Film 4 | 40 | 2 |
| Film 5 | 36 | 2 |
| Film 6 | 38 | 2 |
| Film 7 | 37 | 3 |
| Film 8 | 39 | 3 |
| Film 9 | 37 | 3 |
| Film 10 | 40 | 3 |
| Film 11 | 38 | 3 |
| Film 12 | 35 | 3 |
| Film 13 | 38 | 3 |
| Film 14 | 36 | 2 |
| Film 15 | 35 | 3 |
| Film 16 | 39 | 3 |
| Film 17 | 36 | 2 |
| Film 18 | 36 | 3 |
| Film 19 | 39 | 2 |
| Film 20 | 35 | 3 |
| Film 21 | 37 | 2 |
| Film 22 | 36 | 2 |
| Film 23 | 35 | 2 |
| Film 24 | 36 | 2 |

TABLE 3-continued

| No. | Condition (1) (nm/min) | Condition (2) (nm/min) |
| --- | --- | --- |
| Film 25 | 39 | 2 |
| Film 26 | 37 | 3 |
| Film 27 | 37 | 3 |
| Film 28 | 38 | 3 |
| Film 29 | 38 | 3 |
| Film 30 | 35 | 3 |
| Film 31 | 35 | 3 |
| Film 32 | 40 | 2 |
| Film 33 | 39 | 3 |
| Film 34 | 38 | 2 |
| Film 35 | 39 | 2 |
| Film 36 | 35 | 2 |
| ODL-50 | 40 | 80 |
| SHB-A940 | 200 | 6 |

The etching test shown in Table 3 found that a resist underlayer film obtained by using the composition for forming a resist underlayer film of the present invention exhibits a different dry etching characteristic from an application-type organic film and an application-type silicon-containing film.

Patterning Test

A 200 nm spin-on carbon film ODL-50 (Product from Shin-Etsu Chemical Co., Ltd.: carbon content; 80% by mass) was formed on a silicon wafer. The above compositions (Sol. 1 to 36) were applied thereon and heated at 240° C. for 60 seconds to prepare 50 nm silicon-containing films (Films 1 to 36).

Subsequently, an ArF resist solution for positive development (PR-1) described in Table 4 was applied on the above resist underlayer films and baked at 110° C. for 60 seconds to form 100 nm photoresist films. An immersion top coat (TC-1) described in Table 5 was further applied on the photoresist films and baked at 90° C. for 60 seconds to form 50 nm top coats.

Subsequently, the products were subjected to exposure with an ArF-immersion exposure apparatus (Product from Nikon Corporation; NSR-S610C, NA=1.30, σ=0.98/0.65, 35-degree dipole polarized light illumination, 6%-attenuated phase shift mask), baked at 100° C. for 60 seconds (PEB), and developed with a 2.38% by mass tetramethylammonium hydroxide (TMAH) aqueous solution for 30 seconds to obtain a 43 nm 1:1 positive line-and-space pattern.

The patterning obtained a 43 nm 1:1 positive line-and-space pattern. The pattern collapse was measured with an electronic microscope (Product from Hitachi High-Technologies Corporation (CG4000)) and the cross section was observed with an electronic microscope (Product from Hitachi Ltd. (S-9380)). Table 6 shows the results.

TABLE 4

| No. | Polymer (parts by mass) | Acid generator (parts by mass) | Base (parts by mass) | Solvent (parts by mass) |
| --- | --- | --- | --- | --- |
| PR-1 | ArF resist polymer 1 (100) | PAG1 (7.0) | Quencher (1.0) | PGMEA (2,500) |

Polymer: ArF Resist Polymer 1
  Molecular weight (Mw)=7,800
  Degree of dispersion (Mw/Mn)=1.78

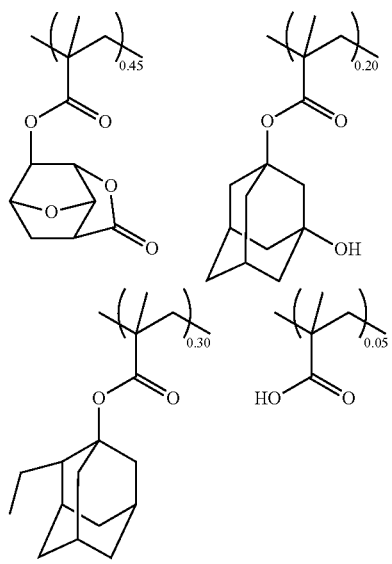

Acid Generator: PAG1

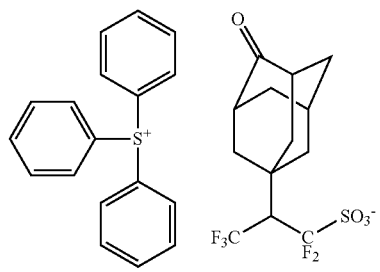

Base: Quencher

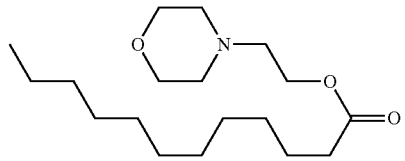 [SMILES: CCCCCCCCCCCC(=O)OCCN1CCOCC1]

TABLE 5

| | Polymer (parts by mass) | Organic solvent (parts by mass) |
|---|---|---|
| TC-1 | Top coat polymer (100) | Diisoamyl ether (2700) 2-methyl-1-butanol (270) |

Polymer: Top Coat Polymer

Molecular weight (Mw)=8,800

Degree of dispersion (Mw/Mn)=1.69

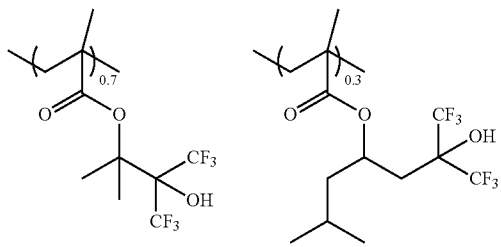

TABLE 6

| Example | Resist underlayer film containing metal oxide | Pattern cross-sectional shape after development | Pattern collapse |
|---|---|---|---|
| Example 1 | Film 1 | Vertical shape | None |
| Example 2 | Film 2 | Vertical shape | None |
| Example 3 | Film 3 | Vertical shape | None |
| Example 4 | Film 4 | Vertical shape | None |
| Example 5 | Film 5 | Vertical shape | None |
| Example 6 | Film 6 | Vertical shape | None |
| Example 7 | Film 7 | Vertical shape | None |
| Example 8 | Film 8 | Vertical shape | None |
| Example 9 | Film 9 | Vertical shape | None |
| Example 10 | Film 10 | Vertical shape | None |
| Example 11 | Film 11 | Vertical shape | None |
| Example 12 | Film 12 | Vertical shape | None |
| Example 13 | Film 13 | Vertical shape | None |
| Example 14 | Film 14 | Vertical shape | None |
| Example 15 | Film 15 | Vertical shape | None |
| Example 16 | Film 16 | Vertical shape | None |
| Example 17 | Film 17 | Vertical shape | None |
| Example 18 | Film 18 | Vertical shape | None |
| Example 19 | Film 19 | Vertical shape | None |
| Example 20 | Film 20 | Vertical shape | None |
| Example 21 | Film 21 | Vertical shape | None |
| Example 22 | Film 22 | Vertical shape | None |
| Example 23 | Film 23 | Vertical shape | None |
| Example 24 | Film 24 | Vertical shape | None |
| Example 25 | Film 25 | Vertical shape | None |
| Example 26 | Film 26 | Vertical shape | None |
| Example 27 | Film 27 | Vertical shape | None |
| Example 28 | Film 28 | Vertical shape | None |
| Example 29 | Film 29 | Vertical shape | None |
| Example 30 | Film 30 | Vertical shape | None |
| Example 31 | Film 31 | Vertical shape | None |
| Example 32 | Film 32 | Vertical shape | None |
| Example 33 | Film 33 | Vertical shape | None |
| Example 34 | Film 34 | Vertical shape | None |
| Example 35 | Film 35 | Vertical shape | None |
| Comparative Example 1 | Film 36 | Negative taper shape | Found |

The patterning test shown in Table 6 found that a resist underlayer film obtained by using the composition for forming a resist underlayer film of the present invention has a sufficient pattern adhesiveness even in case of a fine pattern. Meanwhile, in Comparative Example in which a component (A) is not present on a surface, pattern adhesiveness was unfavorable and pattern collapse was observed.

From the above results, it is obvious that the composition for forming a resist underlayer film of the present invention can provide a resist underlayer film having a pattern adhesiveness relative to fine pattern and a sufficient etching selectivity relative to an organic film and a silicon-containing film.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A composition for forming a resist underlayer film, comprising:

as a component (A), a silicon-containing compound obtained by hydrolysis and/or condensation of one or more kinds of silicon compounds represented by the following general formula (A-1), one or more kinds of silicon compounds represented by the following general formula (A-2), and one or more kinds of metallic compounds represented by the following general formula (A-3), $$R^{1A}_{a1}R^{2A}_{a2}R^{3A}_{a3}Si(OR^{0A})_{(4-a1-a2-a3)} \quad (A\text{-}1)$$

wherein, $R^{0A}$ represents a hydrocarbon group having 1 to 6 carbon atoms; any one or more of $R^{1A}$, $R^{2A}$ and $R^{3A}$ represents an organic group having nitrogen atom, sulfur atom, phosphorus atom, or iodine atom, and the other(s) are a hydrogen atom or a monovalent organic group having 1 to 30 carbon atoms; and a1, a2 and a3 represent 0 or 1 and satisfy $1 \leq a1+a2+a3 \leq 3$, $$R^{5A}_{a5}R^{6A}_{a6}R^{7A}_{a7}Si(OR^{4A})_{(4-a5-a6-a7)} \quad (A\text{-}2)$$

wherein, $R^{4A}$ represents a hydrocarbon group having 1 to 6 carbon atoms; each of $R^{5A}$, $R^{6A}$ and $R^{7A}$ represents a hydrogen atom or a monovalent organic group having 1 to 30 carbon atoms; and a5, a6 and a7 represent 0 or 1 and satisfy $0 \leq a5+a6+a7 \leq 3$, $$L(OR^{8A})_{a8}(OR^{9A})_{a9}(O)_{a10} \quad (A\text{-}3)$$

wherein, $R^{8A}$ and $R^{9A}$ represent an organic group having 1 to 30 carbon atoms; a8, a9 and a10 represent an integer of 0 or more and a8+a9+2×a10 is the same number as the number determined by valency of L; and L is an element belonging to groups of III, IV, or V in a periodic table except for carbon and silicon, and as a component (B), a metal-containing compound obtained by hydrolysis and/or condensation of one or more kinds of metallic compounds represented by the following general formula (B-1), $$M(OR^{0B})_{b0}(OR^{1B})_{b1}(O)_{b2} \quad (B\text{-}1)$$

wherein, $R^{0B}$ and $R^{1B}$ represent an organic group having 1 to 10 carbon atoms, b0, b1 and b2 represent an integer of 0 or more and b0+b1+2×b2 is the same number as the number determined by a valency of M, and M is one selected from the group consisting of aluminum, germanium, titanium, zirconium and hafnium.

2. The composition for forming a resist underlayer film according to claim 1, wherein any one or more of $R^{1A}$, $R^{2A}$ and $R^{3A}$ in the general formula (A-1) is an organic group containing tertiary sulfonium, secondary iodonium, quaternary phosphonium, or quaternary ammonium having non-nucleophilic counter anion.

3. The composition for forming a resist underlayer film according to claim 1, wherein any one or more of $R^{1A}$, $R^{2A}$ and $R^{3A}$ in the general formula (A-1) is an organic group containing primary amine, secondary amine, tertiary amine, or heterocycle.

4. The composition for forming a resist underlayer film according to claim 1, wherein the component (B) contains a metal-containing compound obtained by hydrolysis and/or condensation of one or more kinds of metallic compounds represented by the general formula (B-1) and one or more kinds of silicon compounds represented by the following general formula (B-2),

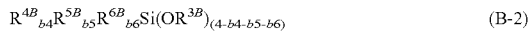  (B-2)

wherein, $R^{3B}$ represents a hydrocarbon group having 1 to 6 carbon atoms; each of $R^{4B}$, $R^{5B}$ and $R^{6B}$ represents a hydrogen atom or a monovalent organic group having 1 to 30 carbon atoms; and b4, b5 and b6 represent 0 or 1 and satisfy $1 \leq b4+b5+b6 \leq 3$.

5. The composition for forming a resist underlayer film according to claim 1, wherein the mass ratio of the component (A) and the component (B) satisfies component (B)≥component (A).

6. The composition for forming a resist underlayer film according to claim 1, wherein L in the general formula (A-3) is any element of boron, aluminum, gallium, yttrium, germanium, titanium, zirconium, hafnium, bismuth, tin, phosphorus, vanadium, arsenic, antimony, niobium, or tantalum.

7. A patterning process on a body to be processed comprising: forming an organic underlayer film on a body to be processed by using an application-type organic underlayer film composition; forming a resist underlayer film on the organic underlayer film by using the composition for forming a resist underlayer film according to claim 1; forming a resist upper layer film on the resist underlayer film by using a composition for forming a resist upper layer film; forming a pattern on the resist upper layer film; transferring the pattern on the resist underlayer film by using the resist upper layer film having the formed pattern as a mask; transferring a pattern on the organic underlayer film by using the resist underlayer film having the transferred pattern as a mask; and transferring a pattern on the body to be processed by using the organic underlayer film having the transferred pattern as a mask.

8. The patterning process according to claim 7, wherein the body to be processed is a semiconductor device substrate coated, as a layer to be processed, with any of metal film, metal carbide film, metal oxide film, metal nitride film, metal oxycarbide film, and metal oxynitride film.

9. The patterning process according to claim 7, wherein a metal that constitutes the body to be processed is silicon, titanium, tungsten, hafnium, zirconium, chromium, germanium, copper, aluminum, indium, gallium, arsenic, palladium, iron, tantalum, iridium, molybdenum or an alloy of these metals.

10. The patterning process according to claim 7, a method for forming a pattern on the resist upper layer film is any of the method of photolithography with a wavelength of 300 nm or less or EUV beam, the method of a direct drawing with electron beam, the directed self assembly method and the nano-imprinting lithography method.

11. A patterning process on a body to be processed comprising: forming an organic hard mask with carbon as a main component on a body to be processed by a CVD method; forming a resist underlayer film on the organic hard mask by using the composition for forming a resist underlayer film according to claim 1; forming a resist upper layer film on the resist underlayer film by using a composition for forming a resist upper layer film; forming a pattern on the resist upper layer film; transferring a pattern on the resist underlayer film by using the resist upper layer film having the formed pattern as a mask; transferring a pattern on the organic hard mask by using the resist underlayer film having the transferred pattern as a mask; and transferring a pattern on the body to be processed by using the organic hard mask having the transferred pattern as a mask.

12. The patterning process according to claim 11, wherein the body to be processed is a semiconductor device substrate coated, as a layer to be processed, with any of metal film, metal carbide film, metal oxide film, metal nitride film, metal oxycarbide film, and metal oxynitride film.

13. The patterning process according to claim 11, wherein a metal that constitutes the body to be processed is silicon, titanium, tungsten, hafnium, zirconium, chromium, germanium, copper, aluminum, indium, gallium, arsenic, palladium, iron, tantalum, iridium, molybdenum or an alloy of these metals.

14. The patterning process according to claim 11, a method for forming a pattern on the resist upper layer film is any of the method of photolithography with a wavelength of 300 nm or less or EUV beam, the method of a direct drawing with electron beam, the directed self assembly method and the nano-imprinting lithography method.

* * * * *